US012002801B2

(12) United States Patent
Wang et al.

(10) Patent No.: US 12,002,801 B2
(45) Date of Patent: Jun. 4, 2024

(54) CHARGING PROTECTION CIRCUIT, CHARGING CIRCUIT, AND ELECTRONIC DEVICE

(71) Applicant: HUAWEI TECHNOLOGIES CO., LTD., Guangdong (CN)

(72) Inventors: Huaifeng Wang, Shenzhen (CN); Jiangtao Yang, Shanghai (CN); Hang Wang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 129 days.

(21) Appl. No.: 17/852,476

(22) Filed: Jun. 29, 2022

(65) Prior Publication Data
US 2022/0328469 A1     Oct. 13, 2022

Related U.S. Application Data

(63) Continuation of application No. PCT/CN2020/138470, filed on Dec. 23, 2020.

(30) Foreign Application Priority Data

Dec. 30, 2019  (CN) .......................... 201911398178.5
Jun. 30, 2020  (CN) .......................... 202010616212.8

(51) Int. Cl.
*H01L 27/02*       (2006.01)
*H02H 9/04*        (2006.01)
*H03K 19/003*      (2006.01)

(52) U.S. Cl.
CPC ...... *H01L 27/0274* (2013.01); *H01L 27/0255* (2013.01); *H01L 27/0277* (2013.01); *H02H 9/046* (2013.01); *H03K 19/00315* (2013.01)

(58) Field of Classification Search
CPC ........ H02M 1/32; H02M 1/0006; H02M 1/08; H02J 7/00304; H02J 7/0031;
(Continued)

(56) References Cited

U.S. PATENT DOCUMENTS 5,510,747 A    4/1996  Williams
10,164,425 B2  12/2018 Wang
(Continued)

FOREIGN PATENT DOCUMENTS

CN    101702508 A    5/2010
CN    201528193 U    7/2010
(Continued)

OTHER PUBLICATIONS

Machine translation of Jiang et al. Chinese Patent Document CN 110445099 A Nov. 2019 (Year: 2019).*
(Continued)

*Primary Examiner* — Kevin J Comber

(57) ABSTRACT

This application relates to a charging protection circuit. The charging protection circuit implements overcurrent protection by using a four-terminal NMOS switching transistor. In the solution provided in this application, floating management is performed on a Sub port of the four-terminal NMOS switching transistor. Specifically, when the four-terminal NMOS switching transistor is turned on, potential of the Sub port is pulled up, to avoid an excessively large internal resistance of the four-terminal NMOS switching transistor caused by an excessively large voltage between the Sub port and a drain of the four-terminal NMOS switching transistor. In addition, this application further provides a charging circuit and an electronic device.

16 Claims, 13 Drawing Sheets

(58) Field of Classification Search
CPC .............. H02J 2207/30; H03K 17/063; H03K 19/00315; H03K 2217/0081; H03K 2217/0018; H03K 2217/066; H03K 2217/0054; H01L 27/0277; H01L 27/0274; H01L 27/0629; H01L 27/0255; H02H 9/04; H02H 9/046
USPC .......................................................... 361/56
See application file for complete search history.

(56) References Cited

U.S. PATENT DOCUMENTS

| | | | |
|---|---|---|---|
| 2002/0039671 | A1 | 4/2002 | Yanagisawa |
| 2007/0127182 | A1* | 6/2007 | Chang ................ H03K 17/0822 361/100 |
| 2010/0225169 | A1* | 9/2010 | Hanawa ............... H03K 17/302 307/127 |
| 2012/0086499 | A1 | 4/2012 | Husain et al. |
| 2016/0315494 | A1 | 10/2016 | Maetani |
| 2017/0207642 | A1 | 7/2017 | Sato et al. |
| 2018/0013298 | A1 | 1/2018 | Abe et al. |

FOREIGN PATENT DOCUMENTS

| | | | | |
|---|---|---|---|---|
| CN | 1980059 | B | | 1/2011 |
| CN | 102005734 | A | | 4/2011 |
| CN | 102881725 | A | | 1/2013 |
| CN | 104779589 | A | | 7/2015 |
| CN | 204651907 | U | | 9/2015 |
| CN | 208797598 | U | * | 4/2019 |
| CN | 208797598 | U | | 4/2019 |
| CN | 110048476 | A | | 7/2019 |
| CN | 110048585 | A | | 7/2019 |
| CN | 110164974 | A | * | 8/2019 ......... H01L 29/0852 |
| CN | 110164974 | A | | 8/2019 |
| CN | 110445099 | A | * | 11/2019 |
| CN | 110445099 | A | | 11/2019 |
| CN | 111725871 | A | | 9/2020 |
| EP | 2226939 | A2 | | 9/2010 |
| JP | 2001177387 | A | | 6/2001 |
| TW | 200826446 | A | | 6/2008 |
| TW | 201238207 | A | | 9/2012 |
| TW | 201727312 | A | | 8/2017 |

OTHER PUBLICATIONS

Machine translation of Wang Chinese Patent Document CN 110164974 A Aug. 2019 (Year: 2019).*
Machine translation of Guo et al. Chinese Patent Document CN 208797598 U Apr. 2019 (Year: 2019).*
Dec. 19, 2022 European search opinion.
Dec. 19, 2022 Supplementary European search report.
Indian Office Action issued in Indian Application No. 202217038155 dated Dec. 28, 2022.
Chinese Office Action issued in Chinese Application No. 202010616212.8 dated Dec. 23, 2020 (7 pages).
International Search Report and Written Opinion issued in PCT Application No. PCT/CN2020/138470 dated Mar. 23, 2021 (11 pages).
Taiwanese document issued in Taiwanese Application No. 11021253530 dated Dec. 23, 2021 (5 pages).
Taiwanese document issued in Taiwanese Application No. 109146796 dated Dec. 22, 2021 (1page).

* cited by examiner

CHARGING PROTECTION CIRCUIT, CHARGING CIRCUIT, AND ELECTRONIC DEVICE

CROSS-REFERENCE TO RELATED APPLICATIONS

This application is a continuation of International Application No. PCT/CN2020/138470, filed on Dec. 23, 2020, which claims priority to Chinese Patent Application No. 201911398178.5, filed on Dec. 30, 2019 and Chinese Patent Application No. 202010616212.8, filed on Jun. 30, 2020. All of the aforementioned patent applications are hereby incorporated by reference in their entireties.

TECHNICAL FIELD

This application relates to the field of power semiconductor technologies and power system technologies, and in particular, to a charging protection circuit, a charging circuit, and an electronic device.

BACKGROUND

Today, many electronic devices have a bidirectional charging capability. For example, a smartphone may not only receive power (usually referred to as forward charging) from an external power supply, but may also charge (usually referred to as reverse charging) another electronic device connected to the smartphone when the another electronic device has low battery. When the electronic device has a bidirectional charging capability, a switching component located in a charging circuit of the electronic device needs to have a bidirectional blocking capability. A metal oxide semiconductor (Metal Oxide Semiconductor, MOS) switching transistor is a common switching component and has a unidirectional blocking capability. Therefore, two MOS switching transistors that have sources connected in series are usually used to implement a bidirectional blocking function.

FIG. 1 is a schematic diagram of a charging protection circuit disposed inside an electronic device in a conventional technology. The charging protection circuit includes a switching transistor for implementing bidirectional blocking, and the switching transistor includes two NMOS switching transistors that have sources connected in series. One terminal of the switching transistor is connected to a universal serial bus USB port of the electronic device, and the other terminal is connected to a battery. The gate drive voltages of the two NMOS switching transistors in the switching transistor can be controlled to control turn-on and turn-off of the two NMOS switching transistors. The two NMOS switching transistors are both in a turn-on state regardless of forward charging or reverse charging, and if an overvoltage occurs, the gate drive voltages of the two NMOS switching transistors are controlled so that at least one of the two NMOS switching transistors is in a turn-off state, thereby implementing an overvoltage protection function.

However, when the two NMOS switching transistors are both turned on, internal resistances of the two NMOS switching transistors may both generate losses, which leads to a relatively large internal loss of the charging protection circuit, and the two NMOS switching transistors are used to implement bidirectional blocking. Consequently, costs of the charging protection circuit are relatively high.

SUMMARY

This application provides a charging protection circuit. The charging protection circuit implements a bidirectional blocking function by using a four-terminal NMOS switching transistor (to be specific, a first four-terminal NMOS switching transistor), to reduce an internal loss and costs of the charging protection circuit at least to some extent. In the charging protection circuit of this application, floating management is further performed on potential of a Sub port of the first four-terminal NMOS switching transistor in the charging protection circuit, so that when the first four-terminal NMOS switching transistor is turned on, a voltage between the Sub port and a first drain that is in the first four-terminal NMOS switching transistor and that is connected to a first power supply interface is reduced, thereby weakening a substrate bias effect. In addition, this application provides a charging circuit and an electronic device including the charging circuit.

According to a first aspect, this application provides a charging protection circuit. The charging protection circuit includes a first four-terminal NMOS switching transistor and a substrate (Substrate, Sub for short) port management circuit. The first four-terminal NMOS switching transistor includes a first drain, a second drain, a gate, and a Sub port. The first drain is connected to a first power supply interface, the second drain is connected to a load, and the gate is connected to a drive circuit.

The Sub port management circuit includes a pull-up circuit connected to the Sub port of the first four-terminal NMOS switching transistor, and the pull-up circuit is configured to: when the first four-terminal NMOS switching transistor is turned on, pull up potential of the Sub port to potential of the first drain or the second drain, or pull up potential of the Sub port to be equal to potential of the first drain or the second drain.

It should be noted that, in this embodiment, the pull-up circuit may be located between the Sub port and the first drain, or may be located between the Sub port and the second drain, or may be located both between the Sub port and the first drain and between the Sub port and the second drain.

That the pull-up circuit exists between the Sub port and the first drain is used as an example, "equal" in "pulling up the potential of the Sub port to be equal to the potential of the first drain" needs to be roughly equal for the following reason: The pull-up circuit usually has a voltage drop when the pull-up circuit is turned on. Therefore, there is a potential difference between the Sub port and the first drain, in other words, the potential of the Sub port is not equal to the potential of the first drain. Because the voltage drop of the pull-up circuit is usually very small, in this embodiment, the voltage drop of the pull-up circuit may be ignored. In this case, it may be considered that the potential of the Sub port is equal to the potential of the first drain.

Further, because the first four-terminal NMOS switching transistor also has a voltage drop, there is a voltage difference between the first drain and the second drain. Therefore, the potential of the Sub port is also roughly equal to the potential of the second drain. In this application, voltage drops of components (for example, the pull-up circuit or the first four-terminal NMOS switching transistor) are not considered. Therefore, it may be considered that the potential of the Sub port is equal to the potential of the first drain and the potential of the second drain.

When the pull-up circuit is located between the Sub port and the second drain, or is located both between the Sub port and the first drain and between the Sub port and the second drain, the foregoing explanation is also met. Therefore, in this application, when it is mentioned that the potential of the Sub port is equal to the potential of the first drain or the potential of the second drain, the voltage drops of the components are not considered. It should be noted that the first four-terminal NMOS switching transistor further includes the gate.

Optionally, the first power supply interface is specifically a universal serial bus USB port.

Optionally, the load may be a battery.

In this embodiment, the first four-terminal NMOS switching transistor is used to replace two NMOS switching transistors that have sources connected in series, to implement a bidirectional blocking function. Usually, an internal resistance of the first four-terminal NMOS switching transistor is less than a sum of internal resistances of the two NMOS switching transistors that have sources connected in series, and costs of the first four-terminal NMOS switching transistor are less than a sum of costs of the two NMOS switching transistors. Therefore, an internal loss and costs of the charging protection circuit may be reduced to some extent by using the solution described in this embodiment.

Further, that the pull-up circuit is located between the Sub port and the first drain is used as an example. In this embodiment, when the first four-terminal NMOS switching transistor is turned on, the potential of the Sub port is pulled up to be equal to the potential of the first drain. Therefore, there is no potential difference (or "voltage") between the Sub port and the first drain. In addition, when the first four-terminal NMOS switching transistor is turned on, the potential of the first drain is equal to the potential of the second drain without considering the voltage drop of the first four-terminal NMOS switching transistor. Therefore, there is no potential difference between the Sub port and the second drain. In this way, in this embodiment, a substrate bias effect occurs neither between the first drain and the Sub port nor between the second drain and the Sub port (for a meaning of the substrate bias effect, refer to the explanation in the specific embodiments). In this case, a quantity of free electrons in a channel of the first four-terminal NMOS switching transistor does not decrease, and an on resistance of the first four-terminal NMOS switching transistor does not increase. Therefore, by using this embodiment, a problem that a loss of the first four-terminal NMOS switching transistor increases due to a substrate bias effect can be avoided.

It should be noted that when the pull-up circuit is located between the Sub port and the second drain, or is located both between the Sub port and the first drain and between the Sub port and the second drain, this embodiment can also implement the foregoing effect. Because principles thereof are similar, details are not described again.

With reference to the first aspect, in a first possible implementation, the pull-up circuit includes a first three-terminal NMOS switching transistor (simply referred to as "three-terminal NMOS-1 switching transistor"). A drain of the three-terminal NMOS-1 switching transistor is connected to the first drain of the first four-terminal NMOS switching transistor, a source of the three-terminal NMOS-1 switching transistor is connected to the Sub port, a gate of the three-terminal NMOS-1 switching transistor is connected to the drive circuit, and a drive voltage provided by the drive circuit enables both the three-terminal NMOS-1 switching transistor and the first four-terminal NMOS switching transistor to be turned on.

It should be noted that the drive voltage provided by the drive circuit is not only used to drive the first four-terminal NMOS switching transistor to be turned on, but also used to drive the three-terminal NMOS-1 switching transistor to be turned on. In addition, the three-terminal NMOS-1 switching transistor is turned on during the turn-on of the first four-terminal NMOS switching transistor.

Because the three-terminal NMOS-1 switching transistor is turned on during the turn-on of the first four-terminal NMOS switching transistor, the potential of the Sub port may be pulled up to the potential of the first drain by using the three-terminal NMOS-1 switching transistor, or may be pulled up to be equal to the potential of the first drain by using the three-terminal NMOS-1 switching transistor. When the first four-terminal NMOS switching transistor is turned on and the voltage drop of the first four-terminal NMOS switching transistor is not considered, the potential of the first drain is equal to the potential of the second drain, and the potential of the Sub port is also the same as the potential of the second drain. Therefore, a substrate bias effect can be avoided in the first four-terminal NMOS switching transistor, and a relatively large loss of the first four-terminal NMOS switching transistor caused by a relatively large on resistance of the first four-terminal NMOS switching transistor is avoided.

With reference to the first possible implementation of the first aspect, in a second possible implementation, a threshold voltage of the three-terminal NMOS-1 switching transistor and a threshold voltage of the first four-terminal NMOS switching transistor have the same value. The drive circuit is configured to provide the same drive voltage for the gate of the first four-terminal NMOS switching transistor and the gate of the three-terminal NMOS-1 switching transistor.

It should be noted that because both the three-terminal NMOS-1 switching transistor and the first four-terminal NMOS switching transistor are N-type MOS switching transistors, phases of the threshold voltages of the three-terminal NMOS-1 switching transistor and the first four-terminal NMOS switching transistor are the same. In other words, phases of threshold voltages of all N-type MOS switching transistors are the same, and phases of threshold voltages of all P-type MOS switching transistors are also the same. However, a phase of a threshold voltage of an N-type MOS switching transistor is opposite to a phase of a threshold voltage of a P-type MOS switching transistor.

Because the threshold voltage of the three-terminal NMOS-1 switching transistor and the threshold voltage of the first four-terminal NMOS switching transistor have the same value, when the same drive voltage is applied to the gate of the three-terminal NMOS-1 switching transistor and the gate of the first four-terminal NMOS switching transistor, the three-terminal NMOS-1 switching transistor and the first four-terminal NMOS switching transistor may be simultaneously turned on and simultaneously turned off. When the three-terminal NMOS-1 switching transistor and the first four-terminal NMOS switching transistor are simultaneously turned on, the potential of the Sub port is pulled to the potential of the first drain. When the first four-terminal NMOS switching transistor is turned on and the voltage drop of the first four-terminal NMOS switching transistor is not considered, the potential of the first drain is equal to the potential of the second drain, and the potential of the Sub port is also the same as the potential of the second drain. Therefore, a substrate bias effect can be avoided in the first four-terminal NMOS switching transistor, and a relatively large loss of the first four-terminal NMOS switching transistor caused by a relatively large on resistance of the first four-terminal NMOS switching transistor is avoided.

It should be noted that, in this application, the three-terminal NMOS switching transistor is a conventional NMOS switching transistor including a source, a drain, and a gate, and the four-terminal NMOS switching transistor is a switching transistor including two drains, one gate, and one Sub port. Specifically, the three-terminal NMOS-1 switching transistor, a second three-terminal NMOS switching transistor (simply referred to as "three-terminal NMOS-2 switching transistor"), and a third three-terminal NMOS switching transistor (simply referred to as "three-terminal NMOS-3 switching transistor") in this application are all three-terminal NMOS switching transistors. Both the first four-terminal NMOS switching transistor and a second four-terminal NMOS switching transistor in this application are four-terminal NMOS switching transistors.

With reference to the second possible implementation of the first aspect, in a third possible implementation, the drive circuit includes a pulse width modulation PWM module and a charge pump. A first input terminal of the charge pump is connected to an output terminal of the PWM module, and is configured to receive a control logic voltage $V_{pwm}$ output by the PWM module. A second input terminal of the charge pump is connected to the first power supply interface, and is configured to receive a bus voltage $V_{bus}$ input from the first power supply interface. An output terminal of the charge pump is connected to the gate of the first four-terminal NMOS switching transistor and the gate of the three-terminal NMOS-1 switching transistor.

The charge pump processes, under control of $V_{pwm}$, $V_{bus}$ to obtain an output voltage $V_{out}$, and applies $V_{out}$ to the gate of the first four-terminal NMOS switching transistor and the gate of the three-terminal NMOS-1 switching transistor.

With reference to the first aspect, in a fourth possible implementation, the pull-up circuit includes a three-terminal NMOS-2 switching transistor. A drain of the three-terminal NMOS-2 switching transistor is connected to the second drain of the first four-terminal NMOS switching transistor, a source of the three-terminal NMOS-2 switching transistor is connected to the Sub port, a gate of the three-terminal NMOS-2 switching transistor is connected to the drive circuit, and a drive voltage provided by the drive circuit enables both the three-terminal NMOS-2 switching transistor and the first four-terminal NMOS switching transistor to be turned on.

It should be noted that the drive voltage provided by the drive circuit is not only used to drive the first four-terminal NMOS switching transistor to be turned on, but also used to drive the three-terminal NMOS-2 switching transistor to be turned on. In addition, the three-terminal NMOS-2 switching transistor is turned on during the turn-on of the first four-terminal NMOS switching transistor.

Because the three-terminal NMOS-2 switching transistor is turned on during the turn-on of the first four-terminal NMOS switching transistor, the potential of the Sub port may be pulled to the potential of the second drain by using the three-terminal NMOS-2 switching transistor, or may be pulled to be equal to the potential of the second drain by using the three-terminal NMOS-2 switching transistor. When the first four-terminal NMOS switching transistor is turned on and the voltage drop of the first four-terminal NMOS switching transistor is not considered, the potential of the second drain is equal to the potential of the first drain, and the potential of the Sub port is also the same as the potential of the first drain. Therefore, a substrate bias effect can be avoided in the first four-terminal NMOS switching transistor, and a relatively large loss of the first four-terminal NMOS switching transistor caused by a relatively large on resistance of the first four-terminal NMOS switching transistor is avoided.

With reference to the fourth possible implementation of the first aspect, in a fifth possible implementation, a threshold voltage of the three-terminal NMOS-2 switching transistor and a threshold voltage of the first four-terminal NMOS switching transistor have the same value. The drive circuit is configured to provide the same drive voltage for the gate of the first four-terminal NMOS switching transistor and the gate of the three-terminal NMOS-2 switching transistor.

Because the threshold voltage of the three-terminal NMOS-2 switching transistor and the threshold voltage of the first four-terminal NMOS switching transistor have the same value, when the same drive voltage is applied to the gate of the three-terminal NMOS-2 switching transistor and the gate of the first four-terminal NMOS switching transistor, the three-terminal NMOS-2 switching transistor and the first four-terminal NMOS switching transistor may be simultaneously turned on and simultaneously turned off. When the three-terminal NMOS-2 switching transistor is turned on, the potential of the Sub port can be pulled up to the potential of the second drain. When the first four-terminal NMOS switching transistor is turned on and the voltage drop of the first four-terminal NMOS switching transistor is not considered, the potential of the second drain is equal to the potential of the first drain, and the potential of the Sub port is also the same as the potential of the first drain. Therefore, by using the solution provided in this embodiment, a substrate bias effect caused by a voltage difference between the Sub port and the second drain and a voltage difference between the Sub port and the first drain can be avoided.

With reference to the fifth possible implementation of the first aspect, in a sixth possible implementation, the drive circuit includes a pulse width modulation PWM module and a charge pump. A first input terminal of the charge pump is connected to an output terminal of the PWM module, and is configured to receive a control logic voltage $V_{pwm}$ output by the PWM module. A second input terminal of the charge pump is connected to the first power supply interface, and is configured to receive a bus voltage $V_{bus}$ input from the first power supply interface. An output terminal of the charge pump is connected to the gate of the first four-terminal NMOS switching transistor and the gate of the three-terminal NMOS-2 switching transistor.

The charge pump processes, under control of $V_{pwm}$, $V_{bus}$ to obtain an output voltage $V_{out}$, and applies $V_{out}$ to the gate of the first four-terminal NMOS switching transistor and the gate of the three-terminal NMOS-2 switching transistor.

With reference to any one of the first to the third possible implementations of the first aspect, in a seventh possible implementation, the pull-up circuit further includes a three-terminal NMOS-2 switching transistor. A drain of the three-terminal NMOS-2 switching transistor is connected to the second drain of the first four-terminal NMOS switching transistor, a source of the three-terminal NMOS-2 switching transistor is connected to the Sub port, a gate of the three-terminal NMOS-2 switching transistor is connected to the drive circuit, and a drive voltage provided by the drive circuit enables the three-terminal NMOS-1 switching transistor, the three-terminal NMOS-2 switching transistor, and the first four-terminal NMOS switching transistor to be all turned on.

In this embodiment, the pull-up circuit not only includes the three-terminal NMOS-1 switching transistor, but also includes the three-terminal NMOS-2 switching transistor. The two three-terminal NMOS switching transistors serve as backup for each other, and even if one of the three-terminal NMOS switching transistors (for example, the three-terminal NMOS-1 switching transistor) is damaged, the other three-terminal NMOS switching transistor (the three-terminal NMOS-2 switching transistor) may still pull up the potential of the Sub port to the potential of the first drain or the second drain of the first four-terminal NMOS switching transistor (where the voltage drop of the first four-terminal NMOS switching transistor is not considered).

With reference to the seventh possible implementation of the first aspect, in an eighth possible implementation, the threshold voltage of the three-terminal NMOS-1 switching transistor, a threshold voltage of the three-terminal NMOS-2 switching transistor, and the threshold voltage of the first four-terminal NMOS switching transistor have the same value. The drive circuit is configured to provide the same drive voltage for the gate of the first four-terminal NMOS switching transistor, the gate of the three-terminal NMOS-1 switching transistor, and the gate of the three-terminal NMOS-2 switching transistor.

It can be learned that the first four-terminal NMOS switching transistor, the three-terminal NMOS-1 switching transistor, and the three-terminal NMOS-2 switching transistor are simultaneously turned on and simultaneously turned off. The two three-terminal NMOS switching transistors serve as backup for each other, and even if one of the three-terminal NMOS switching transistors (for example, the three-terminal NMOS-1 switching transistor) is damaged, the other three-terminal NMOS switching transistor (the three-terminal NMOS-2 switching transistor) may still pull up the potential of the Sub port to the potential of the first drain or the second drain of the first four-terminal NMOS switching transistor (where the voltage drop of the first four-terminal NMOS switching transistor is not considered). In this way, a substrate bias effect caused by a voltage between the Sub port and the first drain and a voltage between the Sub port and the second drain can be avoided. Further, a relatively large internal loss caused by an excessively large on resistance of the first four-terminal NMOS switching transistor can be avoided.

With reference to the eighth possible implementation of the first aspect, in a ninth possible implementation, the drive circuit includes the pulse width modulation PWM module and the charge pump. The first input terminal of the charge pump is connected to the output terminal of the PWM module, and is configured to receive the control logic voltage $V_{pwm}$ output by the PWM module. The second input terminal of the charge pump is connected to the first power supply interface, and is configured to receive the bus voltage $V_{bus}$ input from the first power supply interface. The output terminal of the charge pump is connected to the gate of the first four-terminal NMOS switching transistor, the gate of the three-terminal NMOS-1 switching transistor, and the gate of the three-terminal NMOS-2 switching transistor.

The charge pump processes, under control of $V_{pwm}$, $V_{bus}$ to obtain an output voltage $V_{out}$, and applies $V_{out}$ to the gate of the first four-terminal NMOS switching transistor, the gate of the three-terminal NMOS-1 switching transistor, and the gate of the three-terminal NMOS-2 switching transistor.

With reference to the first aspect, in a tenth possible implementation, the Sub port management circuit further includes a pull-down circuit. The pull-down circuit is connected to the Sub port, and is configured to: when the first four-terminal NMOS switching transistor is turned off, pull down the potential of the Sub port to zero potential.

With reference to any one of the first, second, fourth, fifth, and seventh to ninth possible implementations of the first aspect, in an eleventh possible implementation, the Sub port management circuit further includes a pull-down circuit. The pull-down circuit is connected to the Sub port, and is configured to: when the first four-terminal NMOS switching transistor is turned off, pull down the potential of the Sub port to zero potential.

When the first four-terminal NMOS switching transistor is turned off, the potential of the Sub port is pulled down to ground (GND), thereby avoiding floating of the Sub port. When the potential of the Sub port is zero potential, a voltage between the Sub port and the second drain is less than a voltage that triggers a parasitic transistor inside the first four-terminal NMOS switching transistor to be turned on (referring to FIG. 7). Therefore, the parasitic transistor inside the first four-terminal NMOS switching transistor is not mistakenly triggered, and further, a voltage withstanding capability of the first four-terminal NMOS switching transistor is not decreased.

Usually, when a base voltage of the transistor is greater than 0.7 V, the transistor is turned on. In this embodiment, the base voltage of the transistor is the voltage between the Sub port and the second drain.

In other words, in this embodiment, because the Sub port is directly connected to the GND, to avoid charging a parasitic capacitor C2 of the three-terminal NMOS-2 switching transistor (referring to FIG. 7) by using the bus voltage $V_{bus}$ input from the first power supply interface, there is no voltage at both terminals of C2, the parasitic transistor inside the first four-terminal NMOS switching transistor is not mistakenly triggered to be turned on, and the voltage withstanding capability of the first four-terminal NMOS switching transistor is not decreased.

With reference to any one of the third, sixth, or ninth possible implementation of the first aspect, in a twelfth possible implementation, the Sub port management circuit further includes a pull-down circuit. The pull-down circuit is connected to the Sub port, and is configured to: when the first four-terminal NMOS switching transistor is turned off, pull down the potential of the Sub port to zero potential.

With reference to the twelfth possible implementation of the first aspect, in a thirteenth possible implementation, the pull-down circuit includes a three-terminal NMOS-3 switching transistor. A source of the three-terminal NMOS-3 switching transistor is grounded, a drain of the three-terminal NMOS-3 switching transistor is connected to the Sub port, a gate of the three-terminal NMOS-3 switching transistor is connected to the drive circuit, and a drive voltage provided by the drive circuit enables one of the three-terminal NMOS-3 switching transistor and the first four-terminal NMOS switching transistor to be turned on while the other is turned off.

Because one of the three-terminal NMOS-3 switching transistor and the first four-terminal NMOS switching transistor is turned on while the other is turned off, the three-terminal NMOS-3 switching transistor is turned on while the first four-terminal NMOS switching transistor is turned off. Further, when the three-terminal NMOS-3 switching transistor is turned on, the potential of the Sub port is pulled down to the GND. Therefore, a parasitic transistor in the first four-terminal NMOS switching transistor is not triggered to be turned on (for details, refer to the foregoing explanation), and further, a voltage withstanding capability of the first four-terminal NMOS switching transistor is not decreased.

With reference to the thirteenth possible implementation of the first aspect, in a fourteenth possible implementation, the drive circuit is configured to provide drive voltages with opposite phases for the gate of the three-terminal NMOS-3 switching transistor and the gate of the first four-terminal NMOS switching transistor.

It should be noted that a threshold voltage of the three-terminal NMOS-3 switching transistor and the threshold voltage of the first four-terminal NMOS switching transistor may or may not have the same value.

In this embodiment, the drive circuit is configured to provide drive voltages with opposite phases for the three-terminal NMOS-3 switching transistor and the first four-terminal NMOS switching transistor, so as to ensure that one of the three-terminal NMOS-3 switching transistor and the first four-terminal NMOS switching transistor is turned on while the other is turned off. Specifically, the three-terminal NMOS-3 switching transistor is turned on while the first four-terminal NMOS switching transistor is turned off. When the three-terminal NMOS-3 switching transistor is turned on, the potential of the Sub port is pulled down to the GND. Therefore, the parasitic transistor in the first four-terminal NMOS switching transistor is not triggered to be turned on (for details, refer to the foregoing explanation), and further, the voltage withstanding capability of the first four-terminal NMOS switching transistor is not decreased.

With reference to the fourteenth possible implementation of the first aspect, in a fifteenth possible implementation, the Sub port management circuit further includes an inverter. One terminal of the inverter is connected to the output terminal of the PWM module, and the other terminal is connected to the gate of the three-terminal NMOS-3 switching transistor. The inverter is configured to: perform phase inversion processing on $V_{pwm}$ to obtain a voltage $V_{pwm'}$, and apply $V_{pwm'}$ to the gate of the three-terminal NMOS-3 switching transistor.

In this embodiment, the threshold voltage of the three-terminal NMOS-3 switching transistor and the threshold voltage of the first four-terminal NMOS switching transistor have the same phase but different values, and the threshold voltage of the first four-terminal NMOS switching transistor is greater than the threshold voltage of the three-terminal NMOS-3 switching transistor.

With reference to the tenth or the eleventh possible implementation of the first aspect, in a sixteenth possible implementation, the pull-down circuit includes a pull-down resistor. A first terminal of the pull-down resistor is connected to the Sub port, and a second terminal of the pull-down resistor is grounded.

In this embodiment, because the pull-down resistor is located between the Sub port and the ground (GND), when the first four-terminal NMOS switching transistor is turned off, no current passes through the pull-down resistor. Therefore, the pull-down resistor has no voltage drop, and a voltage of the Sub port is pulled to the GND by the pull-down resistor. A voltage between the Sub port and the second drain is less than a voltage that triggers the parasitic transistor inside the first four-terminal NMOS switching transistor to be turned on (Usually, when the base voltage of the transistor, namely, the voltage between the Sub port and the second drain, is greater than 0.7 V, the transistor is turned on). Therefore, the parasitic transistor inside the first four-terminal NMOS switching transistor is not mistakenly triggered, and further, the voltage withstanding capability of the first four-terminal NMOS switching transistor is not decreased.

With reference to the tenth possible implementation of the first aspect, in a seventeenth possible implementation, the Sub port management circuit includes a complementary metal oxide semiconductor (CMOS) switching transistor. The CMOS switching transistor includes a P-type metal oxide semiconductor (PMOS) switching transistor and a fourth three-terminal NMOS switching transistor (simply referred to as "three-terminal NMOS-4 switching transistor") that have a common gate.

A source of the PMOS switching transistor is connected to the first power supply interface, a drain of the PMOS switching transistor is connected to the Sub port, a drain of the three-terminal NMOS-4 switching transistor is connected to the Sub port, and a source of the three-terminal NMOS-4 switching transistor is grounded.

A drive voltage applied to the gate of the PMOS switching transistor and the gate of the three-terminal NMOS-4 switching transistor and the drive voltage applied to the first four-terminal NMOS switching transistor have opposite phases.

A threshold voltage of the PMOS switching transistor and a threshold voltage of the three-terminal NMOS-4 switching transistor have the same value but opposite phases. This means that one of the PMOS switching transistor and the three-terminal NMOS-4 switching transistor is turned on while the other switching transistor is turned off.

Optionally, a threshold voltage of the first four-terminal NMOS switching transistor and the threshold voltage of the PMOS switching transistor have the same value and the same phase.

In this embodiment, the PMOS switching transistor is configured to: when the first four-terminal NMOS switching transistor is turned on, pull up the potential of the Sub port to a voltage of the first drain or the second drain. Therefore, the pull-up circuit includes the PMOS switching transistor. The three-terminal NMOS-4 switching transistor is configured to: when the first four-terminal NMOS switching transistor is turned off, pull down the potential of the Sub port to the ground (GND). Therefore, the pull-down circuit includes the three-terminal NMOS-4 switching transistor.

When a high voltage is applied to the gate of the first four-terminal NMOS switching transistor, causing the first four-terminal NMOS switching transistor to be turned on, and a low voltage is applied to a gate of the CMOS switching transistor, the PMOS switching transistor in the CMOS switching transistor is turned on, and the three-terminal NMOS-4 switching transistor in the CMOS switching transistor is turned off. In this case, because the Sub port is connected to the first power supply interface by using the PMOS switching transistor, a voltage to ground $V_{sub}$ of the Sub port is equal to a voltage to ground $V_{bus}$ of the first power supply interface. With reference to FIG. 11A, it should be learned that $V_{bus}$ is equal to a voltage to ground of the first drain. Therefore, it may be said that $V_{sub}$ is equal to the voltage to ground of the first drain. When the first four-terminal NMOS switching transistor is turned on, the voltage to ground of the first drain is equal to a voltage to ground of the second drain without considering an on voltage drop of the first four-terminal NMOS switching transistor, and $V_{sub}$ is also equal to the voltage to ground of the second drain. Therefore, there is no voltage (or is no voltage applied) between the first drain and the Sub port or between the second drain and the Sub port, thereby avoiding a substrate bias effect between any one of the two drains and a substrate, and further avoiding a problem that the threshold voltage and the on resistance of the first four-terminal NMOS switching transistor greatly increase and a loss of the first four-terminal NMOS switching transistor increases due to the substrate bias effect.

When the first four-terminal NMOS switching transistor is turned off because the gate of the first four-terminal NMOS switching transistor is grounded, correspondingly, a high voltage is applied to the gate of the CMOS switching transistor, and the PMOS switching transistor in the CMOS switching transistor is turned off and the three-terminal NMOS-4 switching transistor is turned on. In this case, a voltage of the Sub port is pulled to the ground (GND) by the three-terminal NMOS-4 switching transistor that is turned on, thereby avoiding floating of the Sub port. In addition, a voltage between the Sub port and the second drain or a voltage between the Sub port and the first drain is less than a voltage that triggers the parasitic transistor inside the first four-terminal NMOS switching transistor to be turned on (usually, when a base voltage of the transistor, namely, the voltage between the Sub port and the drain 2, is greater than 0.7 V, the transistor is turned on). Therefore, the parasitic transistor inside the first four-terminal NMOS switching transistor is not mistakenly triggered, and further, a voltage withstanding capability of the first four-terminal NMOS switching transistor is not decreased.

With reference to any one of the first aspect or the first to the seventeenth possible implementations of the first aspect, in an eighteenth possible implementation, the charging protection circuit further includes a second power supply interface and a second four-terminal NMOS switching transistor. One drain of the second four-terminal NMOS switching transistor is connected to the second power supply interface, and the other drain is connected between the second drain and the load. With reference to this embodiment, it can be learned that power may be supplied to the load by using a plurality of power supply interfaces.

It should be noted that the second four-terminal NMOS switching transistor further has one gate and one Sub port, and the Sub port of the second four-terminal NMOS switching transistor may also be connected to a Sub port management circuit. In addition, for a setting of the Sub port management circuit, refer to the foregoing Sub port management circuit configured to manage the Sub port of the first four-terminal NMOS switching transistor. The Sub port management circuit configured to manage the Sub port of the second four-terminal NMOS switching transistor is not described in this application.

With reference to the eighteenth possible implementation of the first aspect, in a nineteenth possible implementation, the second power supply interface includes a charging coil and a wireless interface chip. The charging coil is connected to one terminal of the wireless receiving chip, and the other terminal of the wireless interface chip is connected to a drain of the second four-terminal NMOS switching transistor. It can be learned that a power supply manner corresponding to the second power supply interface is a wireless manner.

According to a second aspect, this application provides a charging circuit. The charging circuit includes a first power supply interface, a load, and a charging protection circuit. One terminal of the charging protection circuit is connected to the first power supply interface, and the other terminal is connected to the load.

In any one of the first aspect or the first to the third possible implementations of the first aspect of the charging protection circuit, the charging protection circuit is configured to provide, for the load, power received from the first power supply interface.

In any one of the fourth to the sixth possible implementations of the first aspect of the charging protection circuit, the charging protection circuit is configured to send the power from the load through the first power supply interface.

In any one of the seventeenth possible implementation of the first aspect or the seventh to the ninth possible implementations of the first aspect of the charging protection circuit, the charging protection circuit is configured to provide, for the load, the power received from the first power supply interface, or is configured to send the power from the load through the first power supply interface.

For an effect (or improvement) of the charging circuit, refer to an effect (or improvement) of the foregoing charging protection circuit. Details are not described herein again.

According to a third aspect, this application further provides an electronic device. The electronic device includes the charging circuit according to the second aspect and a processor, and the processor is configured to obtain remaining power information of a load in the charging circuit. Because the electronic device includes the foregoing charging circuit, and the foregoing charging circuit includes the foregoing charging protection circuit, for an effect of the electronic device, refer to an effect of the foregoing charging protection circuit.

DESCRIPTION OF EMBODIMENTS

Before the embodiments of this application are described, terms that may appear next are defined first.

Substrate bias effect: when a potential difference between a substrate of a four-terminal NMOS switching transistor and any drain of the four-terminal NMOS switching transistor is not zero, a depletion region of a reverse-biased PN junction under pressure inside the four-terminal NMOS switching transistor is widened, and consequently, movable charges in a channel of the four-terminal NMOS switching transistor are reduced and a conductivity level is reduced.

Depletion layer: a depletion layer is also referred to as a depletion region, a blocking layer, a barrier region, or a space charge region, and means a high-resistance region that is in a PN junction and in which a quantity of carriers are very small due to dual effects of drift motion and diffusion.

Drift region: a drift region means a region with a low impurity doping concentration in a semiconductor PN junction.

Epitaxial layer: an epitaxial layer means a semiconductor layer grown and deposited on a substrate and located between an N-type drift region and the substrate and between a P-type body part and the substrate.

Figure 5:
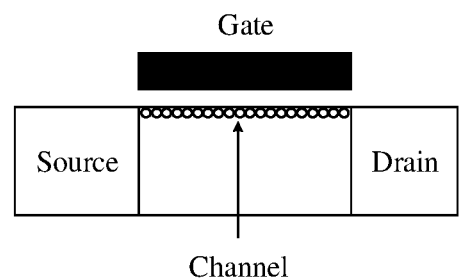
FIG. 5 is a schematic diagram of a MOS switching transistor.

Channel: FIG. 5 is a schematic diagram of a MOS switching transistor, where a channel means a thin semiconductor layer located between a source and a drain in the MOS switching transistor.

Figure 1:
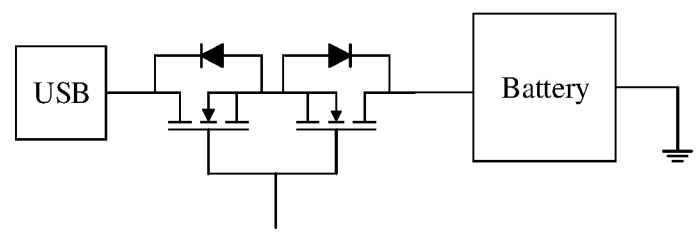
FIG. 1 is a circuit structural diagram of a charging protection circuit located in an electronic device.
Figure 2:
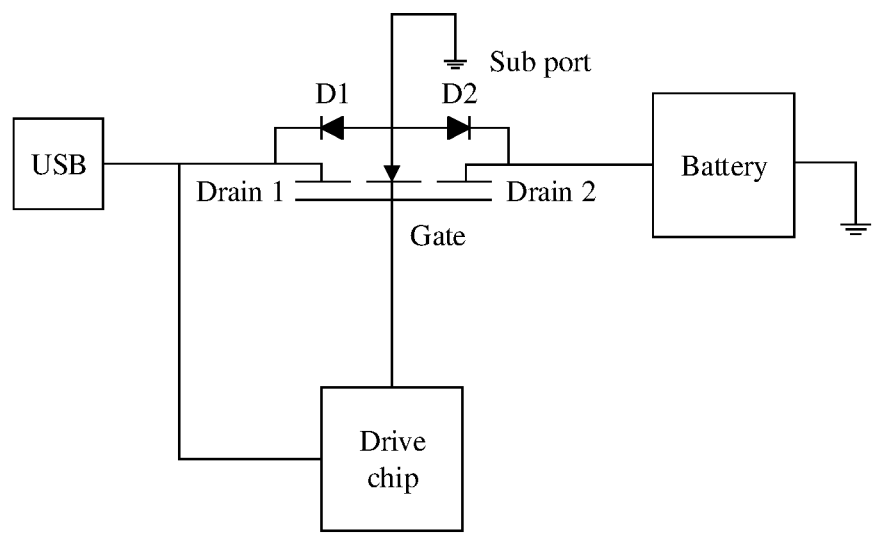
FIG. 2 is another circuit structural diagram of a charging protection circuit located in an electronic device.

FIG. 2 is a structural diagram of a charging protection circuit located inside an electronic device. A four-terminal NMOS switching transistor without a source and capable of implementing bidirectional blocking (or bidirectional voltage withstanding) is used in the charging protection circuit. The four-terminal NMOS switching transistor includes a first drain (Drain 1), a second drain (Drain 2), a gate (Gate), and a substrate Sub port. In the charging protection circuit, the gate (Gate) of the four-terminal NMOS switching transistor is controlled by using a drive circuit (or a "drive chip"). Specifically, turn-on or turn-off of the four-terminal NMOS switching transistor is controlled by using a drive voltage output by a charge pump (Charge Pump) inside the drive circuit. With reference to FIG. 2, it can be easily learned that the Sub port of the four-terminal NMOS switching transistor is grounded. Therefore, potential of the Sub port is usually at a low level.

Figure 3:
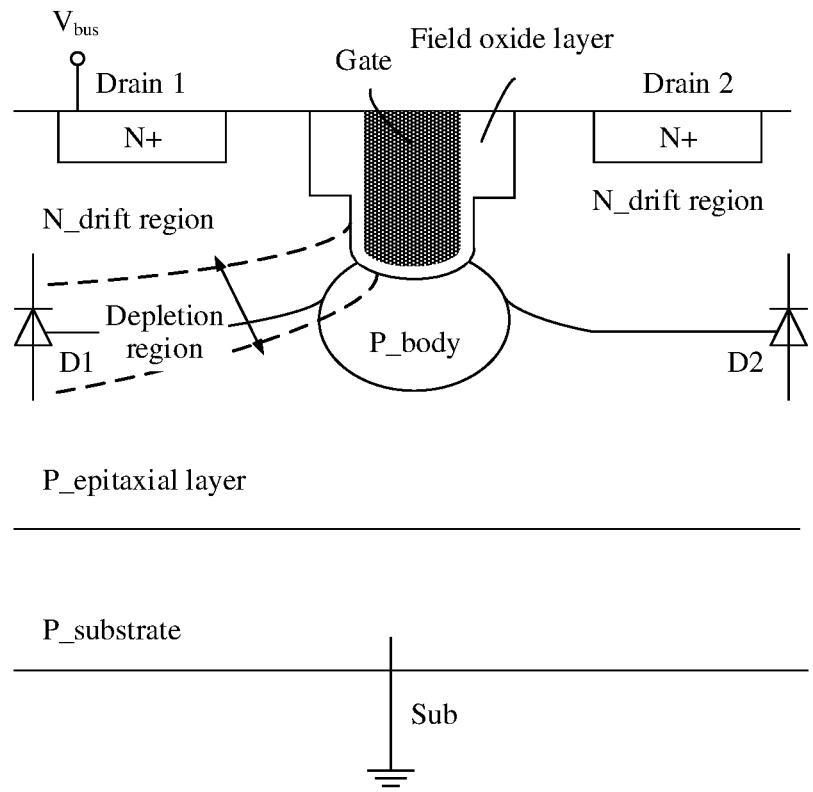
FIG. 3 is a physical cross-sectional view of a four-terminal NMOS switching transistor shown in FIG. 2.

When the four-terminal NMOS switching transistor is turned on, and the first drain (where the first drain means a drain close to a universal serial bus USB port, or means a drain close to an input terminal of a bus voltage $V_{bus}$) is connected to the bus voltage $V_{bus}$, because the Sub port is grounded, a PN junction of a parasitic diode D1 between the first drain and the Sub port and a PN junction of a parasitic diode D2 between the second drain and the Sub port each bear a relatively high reverse voltage $V_{bus}$ (referring to a structural diagram of the four-terminal NMOS switching transistor shown in FIG. 3). Consequently, a substrate bias effect between the first drain and the Sub port and a substrate bias effect between the second drain and the Sub port are severe, and a depletion region (or a space charge region) is greatly expanded. Further, some carriers between an N-type drift region and a P-type epitaxial layer are depleted, free electrons in an N-type channel located in a P-type body part (P_body) are reduced or even completely depleted, and therefore, a channel cannot be formed.

It should be noted that, when the four-terminal NMOS switching transistor is turned on and a voltage drop of the four-terminal NMOS switching transistor is not considered, a voltage to ground of the first drain is equal to a voltage to ground of the second drain, or potential of the first drain is equal to potential of the second drain. Therefore, when the Sub port is grounded and the first drain is connected to the bus voltage $V_{bus}$, a voltage $V_{d1s}$ between the first drain and the Sub port and a voltage $V_{d2s}$ between the second drain and the Sub port each are equal to the bus voltage $V_{bus}$. Further, the parasitic diode D1 between the first drain and the Sub port and the parasitic diode D2 between the second drain and the Sub port each bear a relatively high reverse voltage $V_{bus}$.

Figure 4:
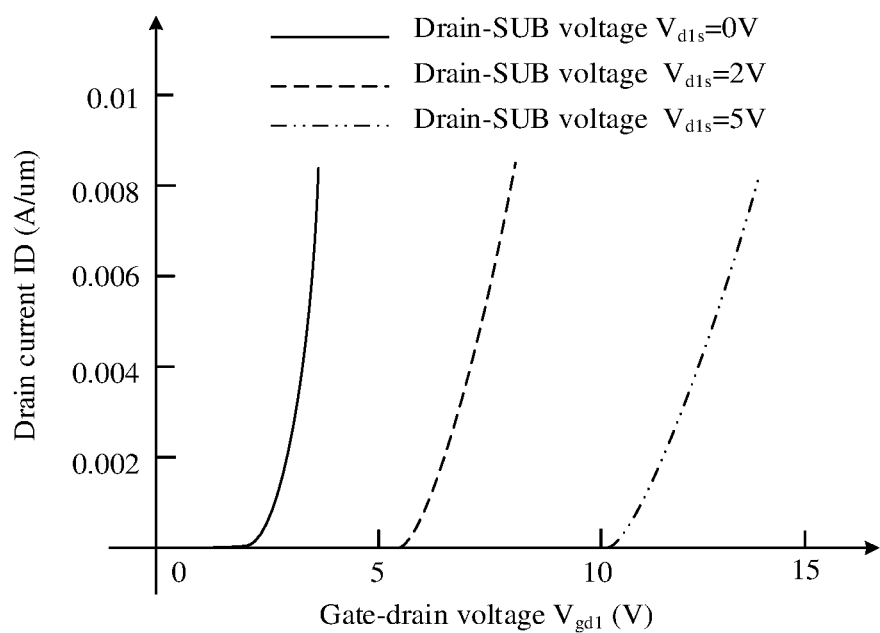
FIG. 4 is a simulation result of a parameter transmission characteristic curve of a four-terminal NMOS switching transistor shown in FIG. 2 when a Sub port is grounded.

FIG. 4 shows a simulation result of a parameter transmission characteristic curve of the four-terminal NMOS switching transistor when the Sub is grounded. FIG. 4 includes three curves, and voltages $V_{d1s}$ corresponding to the three curves are 0 V, 2 V, and 5 V, respectively. As explained above, the voltage $V_{d1s}$ means a voltage between the first drain and the Sub port. When $V_{d1s}$ is equal to 0 V, a threshold voltage $V_{gd1}$ of the four-terminal NMOS switching transistor is about 2 V. When $V_{d1s}$ is equal to 2 V, the threshold voltage $V_{gd1}$ of the four-terminal NMOS switching transistor is about 5.5 V. When $V_{d1s}$ is equal to 5 V, the threshold voltage $V_{gd1}$ of the four-terminal NMOS switching transistor is about 10 V. Therefore, as $V_{d1s}$ increases, the threshold voltage $V_{gd1}$ of the four-terminal NMOS switching transistor also increases. When an on current of the four-terminal NMOS switching transistor is 0.002 A, and $V_{d1s}$=0 V, a voltage between the gate of the four-terminal NMOS switching transistor and the first drain is about 3 V, and correspondingly, an internal resistance of the four-terminal NMOS switching transistor is about 1.5 K·Ω and a loss of the four-terminal NMOS switching transistor is about 0.006 W. When the on current of the four-terminal NMOS switching transistor is 0.002 A, and $V_{d1s}$=2 V, the voltage between the gate of the four-terminal NMOS switching transistor and the first drain is about 6.5 V, and correspondingly, the internal resistance of the four-terminal NMOS switching transistor is about 3.25 K·Ω and the loss of the four-terminal NMOS switching transistor is about 0.013 W. When the on current of the four-terminal NMOS switching transistor is 0.002 A, and $V_{d1s}$=5 V, the voltage between the gate of the four-terminal NMOS switching transistor and the first drain is about 12 V, and correspondingly, the internal resistance of the four-terminal NMOS switching transistor is about 6 K·Ω and the loss of the four-terminal NMOS switching transistor is about 0.024 W. Therefore, as $V_{d1s}$ increases, the internal resistance and internal loss of the four-terminal NMOS switching transistor also increase. Therefore, decreasing the voltage $V_{d1s}$ between the first drain and the Sub port becomes a problem that needs to be resolved.

It should be noted that, when the four-terminal NMOS switching transistor is turned on, a voltage between the first drain and the second drain of the four-terminal NMOS switching transistor (or the voltage drop of the four-terminal NMOS switching transistor) is greater than 0 V (for example, may be 0.1 V). In this application, unless otherwise specified, the voltage drop of the four-terminal NMOS switching transistor is ignored, in other words, it is considered that the four-terminal NMOS switching transistor has no voltage drop.

Figure 6:
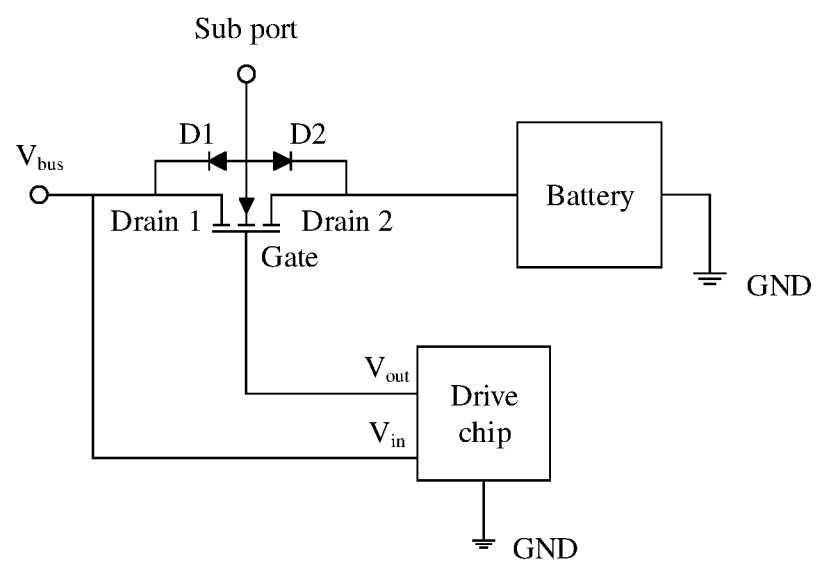
FIG. 6 is a circuit structural diagram of a charging protection circuit according to this application.
Figure 7:
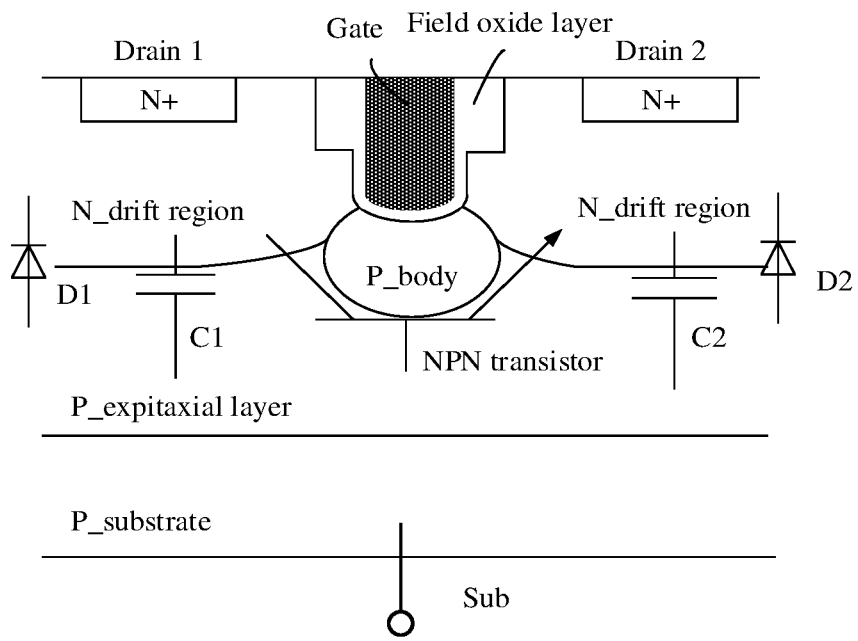
FIG. 7 is a schematic physical cross-sectional diagram of a parasitic transistor in a four-terminal NMOS switching transistor in the charging protection circuit shown in FIG. 6 when the four-terminal NMOS switching transistor is turned off.

Further, FIG. 6 is another structural diagram of a charging protection circuit. It should be noted that a four-terminal NMOS switching transistor located in the charging protection circuit also includes a first drain (Drain 1), a second drain (Drain 2), a gate, and a substrate Sub port. A difference between the charging protection circuit shown in FIG. 6 and the charging protection circuit shown in FIG. 2 lies in that, in the four-terminal NMOS switching transistor shown in FIG. 6, the Sub port is always in a floating state. When a gate of the four-terminal NMOS switching transistor is connected to low potential, the four-terminal NMOS switching transistor needs to be turned off. However, at the same time, if a bus voltage $V_{bus}$ is also applied to the first drain, two back-to-back diodes (D1 and D2) that have a common anode and that are between the first drain and the second drain are under pressure. As shown in FIG. 7, since D1 and D2 each have a junction capacitor (where the junction capacitor of D1 is C1, and the junction capacitor of D2 is C2), the bus voltage $V_{bus}$ is used to charge the two junction capacitors C1 and C2, and accordingly, a voltage across each of the junction capacitors C1 and C2 increases.

Figure 8:
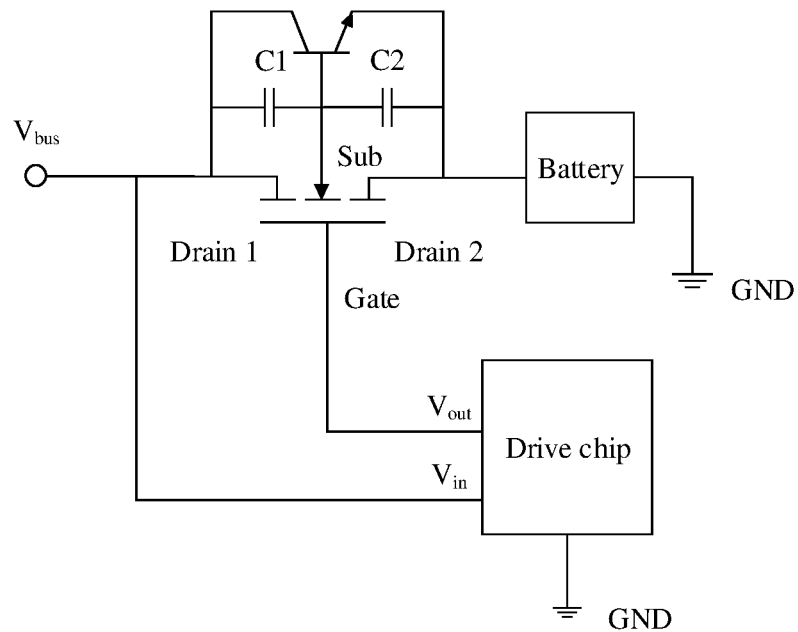
FIG. 8 is a circuit structural diagram of a parasitic transistor in a four-terminal NMOS switching transistor in the charging protection circuit shown in FIG. 6 when the four-terminal NMOS switching transistor is turned off.
Figure 9A:
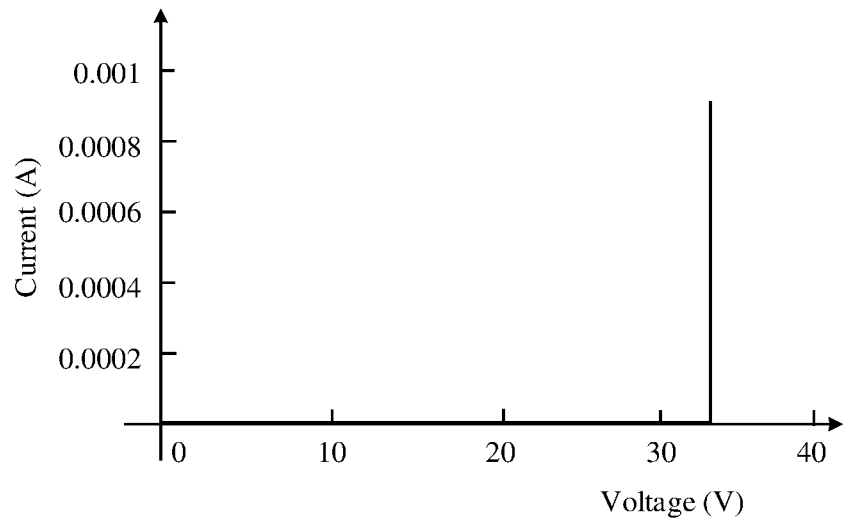
FIG. 9A is a curve diagram of voltage withstanding characteristics of two drains of a four-terminal NMOS switching transistor when a Sub port is grounded.
Figure 9B:
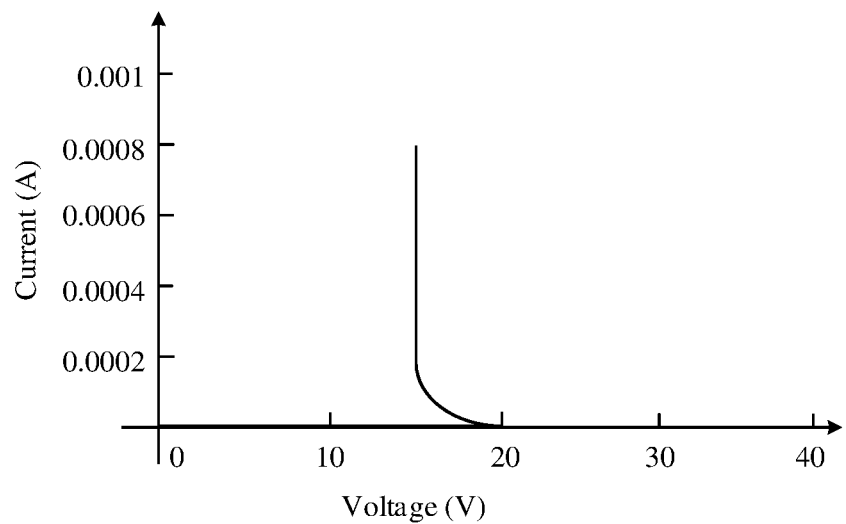
FIG. 9B is a curve diagram of voltage withstanding characteristics of two drains of a four-terminal NMOS switching transistor when a Sub port is floating.

Referring to FIG. 7 and FIG. 8, the back-to-back diodes D1 and D2 having a common anode are equivalent to one NPN transistor. As the bus voltage $V_{bus}$ increases, if a divided voltage of C2 exceeds 0.7 V, the parasitic NPN transistor is triggered to be turned on (usually, when a base voltage of the transistor, namely, a voltage between the Sub port and the second drain, is greater than 0.7 V, the transistor is turned on), and accordingly, a voltage withstanding capability of the four-terminal NMOS switching transistor is decreased. FIG. 9A and FIG. 9B are respectively curve diagrams of voltage withstanding characteristics between the first drain and the second drain of the four-terminal NMOS switching transistor when the Sub port of the four-terminal NMOS switching transistor is grounded (as shown in FIG. 9A) and when the Sub port of the four-terminal NMOS switching transistor is floating (as shown in FIG. 9B).

As shown in FIG. 9A, when the Sub port is grounded, a maximum voltage that can be borne between the first drain and the second drain of the four-terminal NMOS switching transistor is about 32 V. As shown in FIG. 9B, when the Sub port is floating, a maximum voltage that can be borne between the first drain and the second drain of the four-terminal NMOS switching transistor is about 15 V. Briefly, a voltage withstanding capability between the first drain and the second drain of the four-terminal NMOS switching transistor is decreased from more than 30 V to less than 20 V. In actual use, because the voltage withstanding capability of the four-terminal NMOS switching transistor is decreased, the four-terminal NMOS switching transistor may be broken down, causing a catastrophic result of the charging protection circuit in which the four-terminal NMOS switching transistor is applied. Therefore, maintaining (or not decreasing) the voltage withstanding capability of the four-terminal NMOS switching transistor is also a problem that needs to be resolved.

With reference to the foregoing description, it can be learned that, in the four-terminal NMOS switching transistor in this application, that the Sub port of the four-terminal NMOS switching transistor is grounded causes the voltage $V_{d1s}$ s between the first drain and the Sub port to be large, which further leads to a severe substrate bias effect and an increase in the loss of the four-terminal NMOS switching transistor; and that the Sub port of the four-terminal NMOS switching transistor is floating affects the voltage withstanding capability of the four-terminal NMOS switching transistor.

To resolve all the foregoing problems, this application first provides an electronic device. The electronic device may be specifically a smartphone, an electric vehicle, a tablet computer, a smartwatch, a smart band, or the like. Specifically, the electronic device can be charged, and can also charge an external device. The charging can be in a wired or wireless manner. For example, a smartphone can be charged in a wired manner, and can also charge an external device (for example, a smartwatch or a smart band) in a wireless manner. Alternatively, for example, an electric vehicle can be charged in a wired manner, and can also charge an external device such as a smartphone in a wired manner.

Figure 10A:
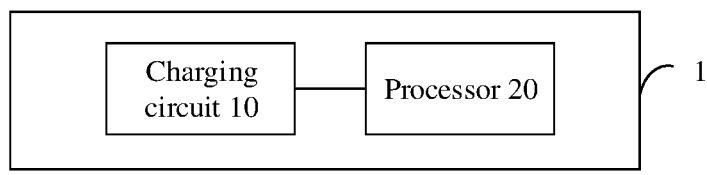
FIG. 10A is a schematic diagram of an electronic device according to this application.

It should be noted that, as shown in FIG. 10A, an electronic device 1 includes at least one charging circuit 10 and a processor 20. Specifically, the processor 20 is configured to obtain remaining power information of a load 15 in the charging circuit 10. Certainly, the electronic device 1 may further include another component, for example, a memory and a drive circuit (none of which is shown in the figure).

Figure 10B:
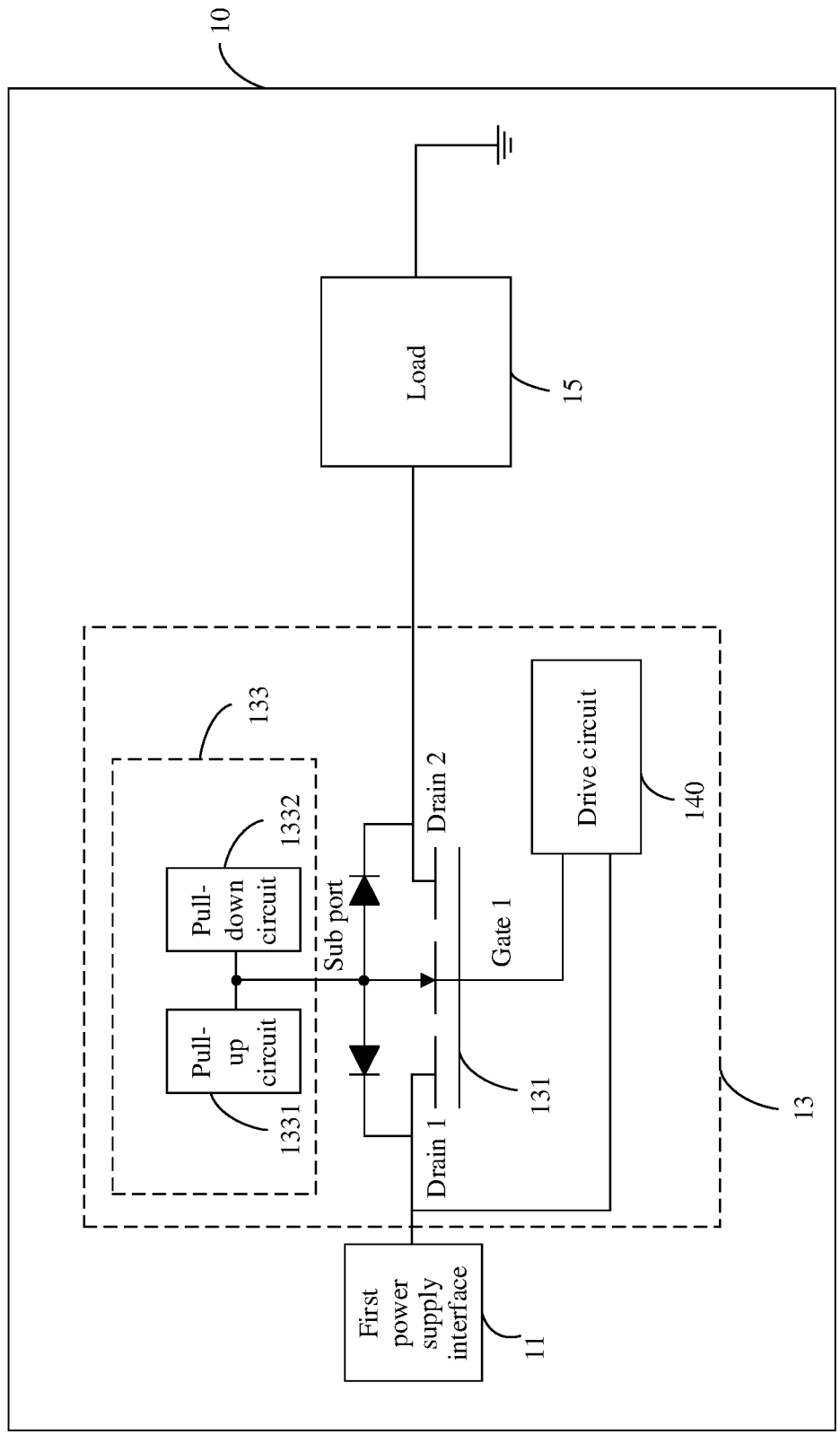
FIG. 10B is a circuit structural diagram of a charging circuit in the electronic device shown in FIG. 10A.

As shown in FIG. 10B, the charging circuit 10 includes a first power supply interface 11, a load 15, and a charging protection circuit 13. The load 15 is typically a battery. When the electronic device 1 is a smartphone, the first power supply interface 11 may be a USB port. The charging protection circuit 13 will be explained in detail below.

In the charging protection circuit 13 provided in this application, a first four-terminal NMOS switching transistor 131 is used to replace two NMOS switching transistors that have sources connected in series, to implement bidirectional blocking, and in addition, a substrate (Substrate, Sub) port management circuit (simply referred to as "Sub port management circuit") 133 is also provided to perform floating management on potential of a Sub port of the first four-terminal NMOS switching transistor 131.

For ease of description, in FIG. 10B, the first power supply interface 11 is a USB port. In the charging protection circuit 13 shown in FIG. 11A, the first four-terminal NMOS switching transistor 131 includes a first drain (Drain 1), a second drain (Drain 2), a gate (Gate 1), and a Sub port. The first drain is connected to the USB port 11, the second drain is connected to the load 15, and the gate is connected to a drive circuit 140. Further, a Sub port management circuit 133 includes a pull-up circuit 1331, the pull-up circuit 1331 is connected to the Sub port, and the pull-up circuit 1331 is configured to: when the first four-terminal NMOS switching transistor 131 is turned on, pull up the Sub port to potential of the first drain or the second drain.

Figure 11A:
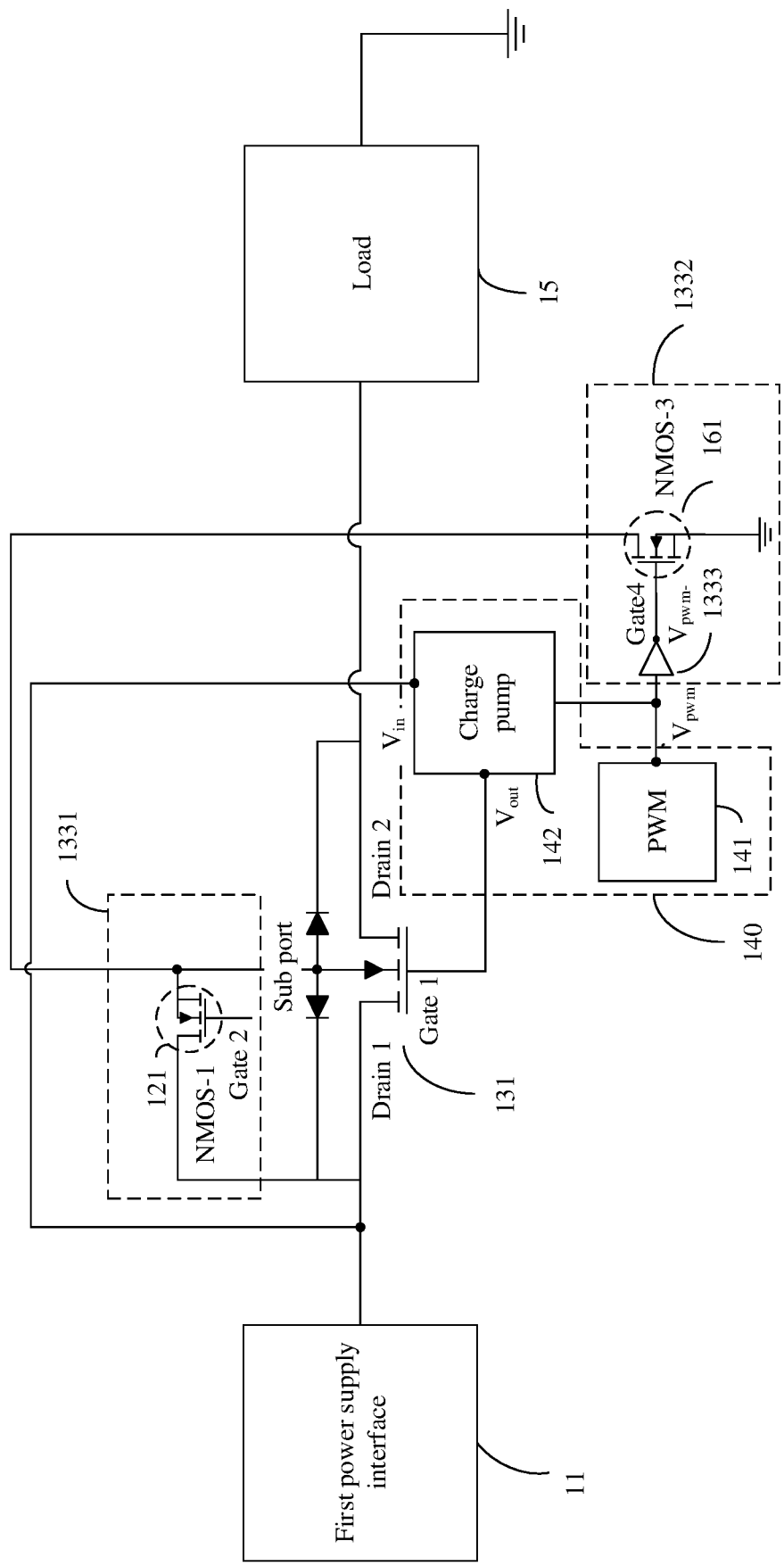
FIG. 11A is a structural diagram of a charging protection circuit according to this application.

As shown in FIG. 11A, the pull-up circuit 1331 may be a first three-terminal NMOS switching transistor 121 (simply referred to as "three-terminal NMOS-1 switching transistor"). With reference to FIG. 11A, it can be learned that a drain of the three-terminal NMOS-1 switching transistor 121 is connected to the first drain, a source of the three-terminal NMOS-1 switching transistor 121 is connected to the Sub port, and a gate (Gate 2) of the three-terminal NMOS-1 switching transistor 121 is connected to the drive circuit 140. In addition, a drive voltage provided by the drive circuit 140 enables both the three-terminal NMOS-1 switching transistor 121 and the first four-terminal NMOS switching transistor 131 to be turned on.

In specific implementation, a threshold voltage of the three-terminal NMOS-1 switching transistor 121 and a threshold voltage of the first four-terminal NMOS switching transistor 131 have the same phase (referring to the foregoing related explanation) and also the same value. The drive circuit 140 is configured to provide the same gate drive voltage for the three-terminal NMOS-1 switching transistor 121 and the first four-terminal NMOS switching transistor 131.

It should be explained that a gate drive voltage enables a MOS switching transistor to be turned on or turned off. It is usually considered that when the gate drive voltage is higher than a threshold voltage of the MOS switching transistor, the MOS switching transistor is turned on; and when the gate drive voltage is lower than the threshold voltage of the MOS switching transistor, the MOS switching transistor is not turned on (or turned off). In this embodiment, the threshold voltage of the three-terminal NMOS-1 switching transistor 121 and the threshold voltage of the first four-terminal NMOS switching transistor 131 are equal. In this case, when the same drive voltage is input to the gates of the three-terminal NMOS-1 switching transistor 121 and the first four-terminal NMOS switching transistor 131, the three-terminal NMOS-1 switching transistor 121 and the first four-terminal NMOS switching transistor 131 are both turned on or turned off.

It should be noted that the three-terminal NMOS switching transistor described in this application is a conventional NMOS switching transistor, and includes three terminals including a source, a drain, and a gate. Correspondingly, the four-terminal NMOS switching transistor in this application includes four terminals, which are respectively two drains, one gate, and one Sub port.

It should be noted that "first" and "second" in this application are only used to represent different similar components, for example, "first four-terminal NMOS switching transistor" and "second four-terminal NMOS switching transistor" are used to indicate nothing but the fact that the two transistors are two different four-terminal NMOS switching transistors.

It should be further noted that, in this application, unless otherwise specified, a voltage drop of the three-terminal MOS switching transistor is not considered, in other words, it is considered that the three-terminal MOS switching transistor has no voltage drop.

With reference to the foregoing embodiment, when the first four-terminal NMOS switching transistor 131 is turned on, the three-terminal NMOS-1 switching transistor 1331 is also turned on. In this case, the potential (or a "voltage to ground") of the Sub port is equal to the potential (or a "voltage to ground") of the first drain. In addition, when the first four-terminal NMOS switching transistor 131 is turned on, the potential (or the "voltage to ground") of the first drain is equal to the potential (or a "voltage to ground") of the second drain. Therefore, the potential of the Sub port is also equal to the potential of the second drain. Therefore, any one of a voltage $V_{d1s}$ between the first drain and the Sub port or a voltage $V_{d2s}$ between the second drain and the Sub port is zero.

With reference to the foregoing description, it can be learned that, by using the technical solution provided in this embodiment, a substrate bias effect between the first drain and the Sub port and a substrate bias effect between the second drain and the Sub port can be reduced or eliminated. Reducing of free electrons in an N-type channel in the first four-terminal NMOS switching transistor 131 is avoided or prevented at least to some extent, and further, increasing of an on resistance and internal loss of the first four-terminal NMOS switching transistor 131 is avoided or prevented at least to some extent.

Figure 11B:
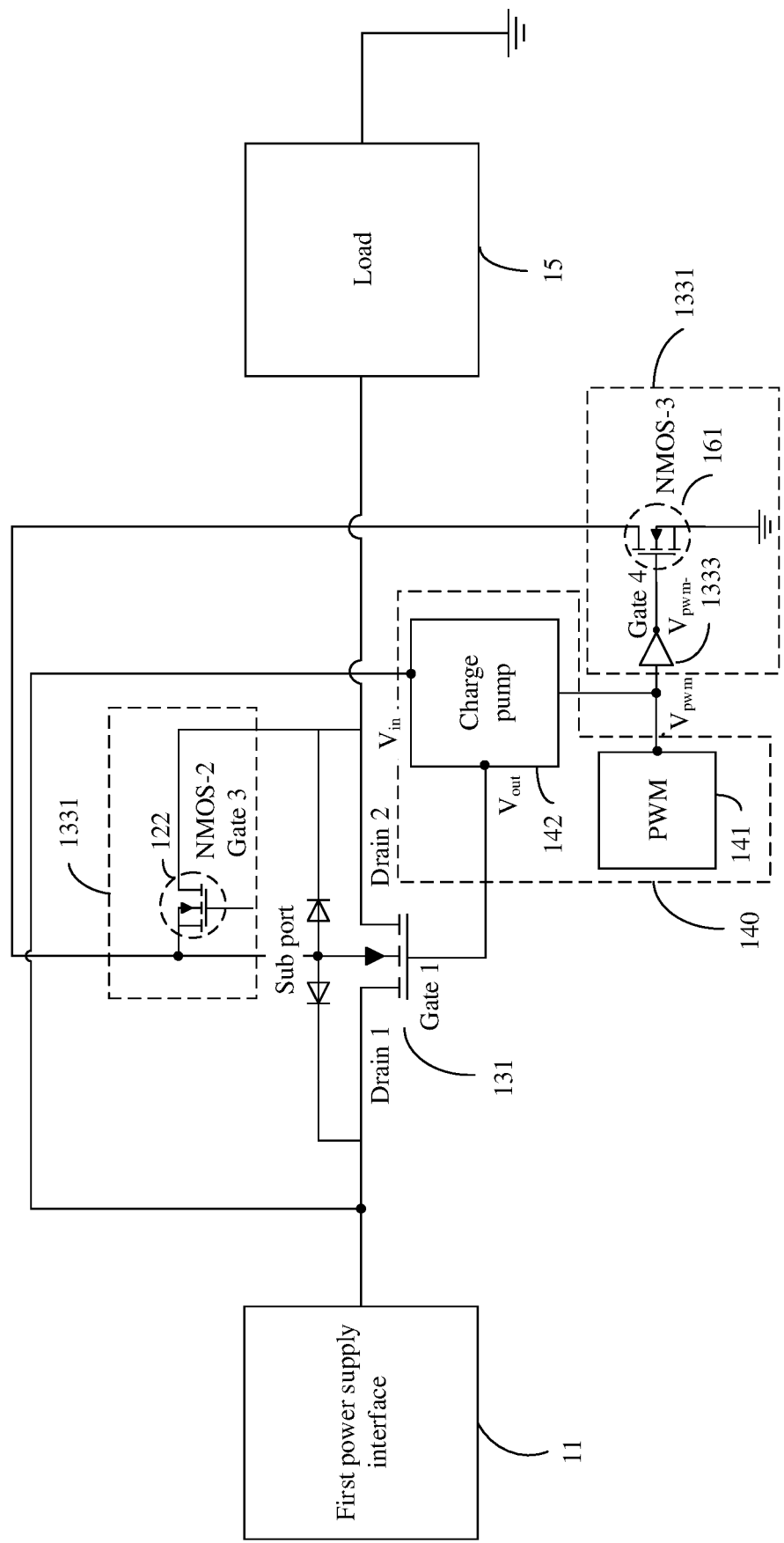
FIG. 11B is another structural diagram of a charging protection circuit according to this application.

In another embodiment of this application, as shown in FIG. 11B, a pull-up circuit 1331 may be a second three-terminal NMOS switching transistor (simply referred to as "three-terminal NMOS-2 switching transistor") 122. With reference to FIG. 11B, it can be learned that a drain of the three-terminal NMOS-2 switching transistor 122 is connected to the second drain, a source of the three-terminal NMOS-2 switching transistor 122 is connected to the Sub port, and a gate (Gate 3) of the three-terminal NMOS-2 switching transistor 122 is connected to the drive circuit 140. In addition, a drive voltage provided by the drive circuit 140 enables both the three-terminal NMOS-2 switching transistor 122 and the first four-terminal NMOS switching transistor 131 to be turned on.

In specific implementation, a threshold voltage of the three-terminal NMOS-2 switching transistor 122 and a threshold voltage of the first four-terminal NMOS switching transistor 131 have the same phase and also the same value, and therefore, the drive circuit 140 is configured to provide the same gate drive voltage for the three-terminal NMOS-2 switching transistor 122 and the first four-terminal NMOS switching transistor 131. Accordingly, the three-terminal NMOS-2 switching transistor 122 and the first four-terminal NMOS switching transistor 131 are both turned on and turned off.

When the first four-terminal NMOS switching transistor 131 is turned on, the three-terminal NMOS-2 switching transistor 122 is also turned on. In this case, the potential (or a "voltage to ground") of the Sub port is equal to the potential of the second drain. In addition, when the first four-terminal NMOS switching transistor 131 is turned on, the potential of the second drain is equal to the potential of the first drain. Therefore, the potential of the Sub port is also equal to the potential of the first drain. Therefore, any one of a voltage $V_{d1s}$ between the first drain and the Sub port or a voltage $V_{d2s}$ between the second drain and the Sub port is zero. Therefore, by using the technical solution provided in this embodiment, a substrate bias effect between the first drain and the Sub port and a substrate bias effect between the second drain and the Sub port can be reduced or eliminated. Reducing of free electrons in an N-type channel in the first four-terminal NMOS switching transistor 131 is avoided or prevented at least to some extent, and further, increasing of an on resistance and internal loss of the first four-terminal NMOS switching transistor 131 is avoided or prevented at least to some extent.

Figure 11C:
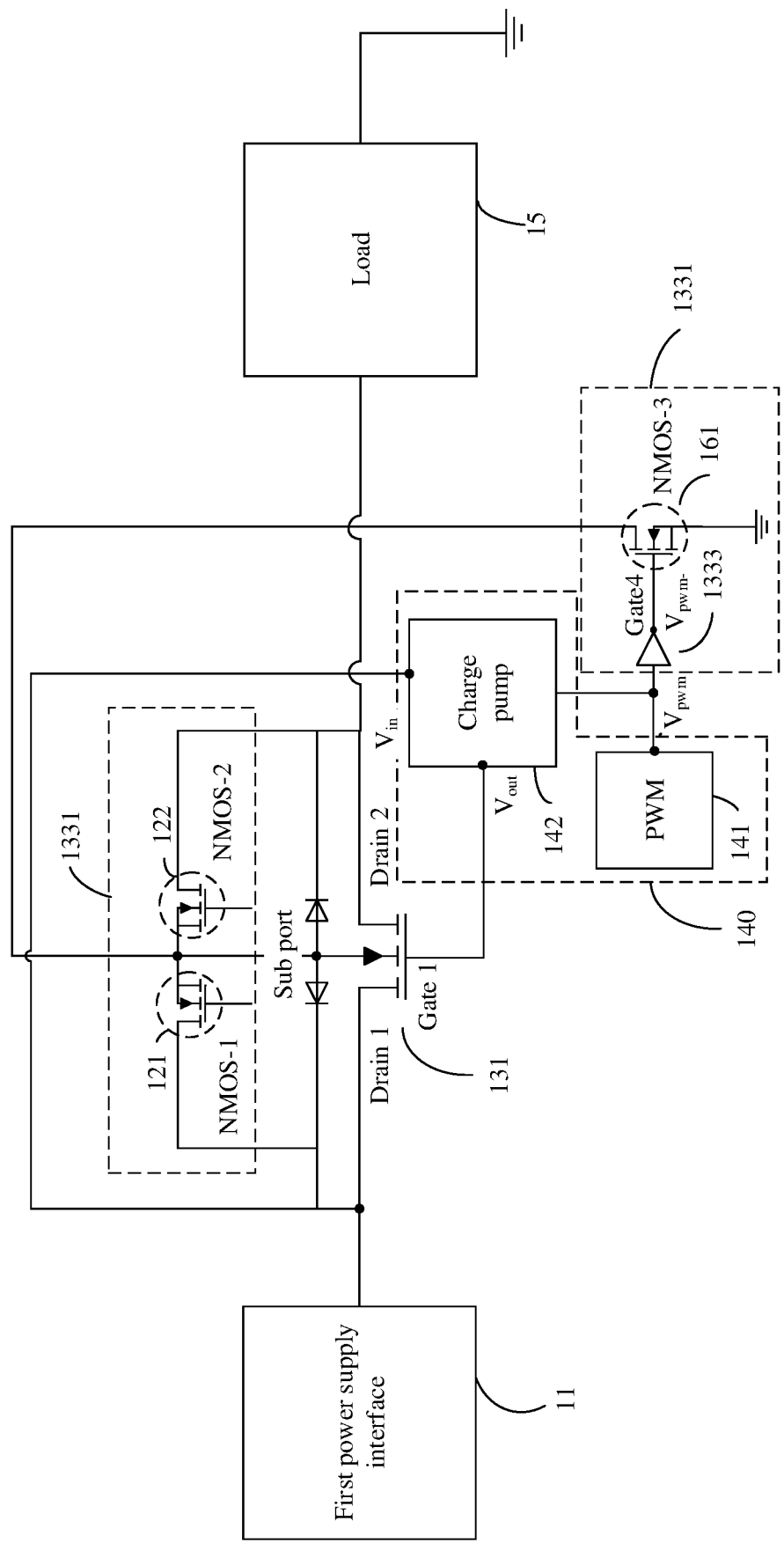
FIG. 11C is still another structural diagram of a charging protection circuit according to this application.

In still another embodiment of this application, as shown in FIG. 11C, a pull-up circuit 1331 may include both a three-terminal NMOS-1 switching transistor 121 and a three-terminal NMOS-2 switching transistor 122. With reference to FIG. 11C, it can be learned that a drain of the three-terminal NMOS-1 switching transistor 121 is connected to the first drain, and a drain of the three-terminal NMOS-2 switching transistor 122 is connected to the second drain. A source of the three-terminal NMOS-1 switching transistor 121 and a source of the three-terminal NMOS-2 switching transistor 122 are both connected to the Sub port. A gate of the three-terminal NMOS-1 switching transistor 121 and a gate of the three-terminal NMOS-2 switching transistor 122 are both connected to the drive circuit 140. A drive voltage provided by the drive circuit 140 enables the three-terminal NMOS-1 switching transistor 121, the three-terminal NMOS-2 switching transistor 122, and the first four-terminal NMOS switching transistor 131 to be all turned on.

In specific implementation, a threshold voltage of the first four-terminal NMOS switching transistor 131 and each of a threshold voltage of the three-terminal NMOS-1 switching transistor 121 and a threshold voltage of the three-terminal NMOS-2 switching transistor 122 have the same value and also the same phase. Accordingly, the drive circuit 140 is configured to provide the same gate drive voltage for the three transistors (the three-terminal NMOS-1 switching transistor 121, the three-terminal NMOS-2 switching transistor 122, and the first four-terminal NMOS switching transistor 131), to drive all the three switching transistors to be turned on or turned off.

In this embodiment, the three-terminal NMOS-1 switching transistor 121 and the three-terminal NMOS-2 switching transistor 122 play a mutual backup role, in other words, even if one of the two transistors is faulty, the potential of the Sub port can still be pulled up to the potential of the first drain and the potential of the second drain.

As shown in FIG. 11A, FIG. 11B, and FIG. 11C, the drive circuit 140 includes a pulse width modulation PWM module 141 and a charge pump (Charge Pump) 142. The charge pump 142 includes two input terminals and one output terminal, and the two input terminals are respectively named as a first input terminal and a second input terminal. Specifically, the first input terminal of the charge pump 142 is connected to an output terminal of the PWM module 141, and is configured to receive a control logic voltage $V_{pwm}$ output by the PWM module 141. The second input terminal of the charge pump 142 is connected to the first power supply interface 11, and is configured to receive a bus voltage $V_{bus}$ input from the first power supply interface 11. The charge pump 142 is configured to: process, under control of the control logic voltage $V_{pwm}$, the received bus voltage $V_{bus}$ to obtain an output voltage $V_{out}$, and output the output voltage $V_{out}$ from the output terminal of the charge pump 142.

Optionally, when $V_{pwm}$ is at high potential, $V_{out}$ is a high voltage, and when $V_{pwm}$ is at low potential, $V_{out}$ is a low voltage. Optionally, when $V_{pwm}$ is at high potential, 5 V is added to the bus voltage $V_{bus}$ input from the second input terminal of the charge pump to obtain $V_{out}$. When $V_{pwm}$ is at low potential, a value of $V_{out}$ is zero As shown in FIG. 11A, the output terminal of the charge pump 142 is connected to the gate of the three-terminal NMOS-1 switching transistor 121 and the gate of the first four-terminal NMOS switching transistor 131. The charge pump 142 is configured to output the output voltage $V_{out}$ to the gate of the three-terminal NMOS-1 switching transistor 121 and the gate of the first four-terminal NMOS switching transistor 131. The output voltage $V_{out}$ is used as a gate drive voltage of the three-terminal NMOS-1 switching transistor 121 and a gate drive voltage of the first four-terminal NMOS switching transistor 131, and enables the three-terminal NMOS-1 switching transistor 121 and the first four-terminal NMOS switching transistor 131 to be turned on or turned off.

As shown in FIG. 11B, the output terminal of the charge pump 142 is connected to the gate of the three-terminal NMOS-2 switching transistor 122 and the gate of the first four-terminal NMOS switching transistor 131. The charge pump 142 is configured to output the output voltage $V_{out}$ to the gate of the three-terminal NMOS-2 switching transistor 122 and the gate of the first four-terminal NMOS switching transistor 131. The output voltage $V_{out}$ is used as a gate drive voltage of the three-terminal NMOS-2 switching transistor 122 and a gate drive voltage of the first four-terminal NMOS switching transistor 131, and enables the three-terminal NMOS-2 switching transistor 122 and the first four-terminal NMOS switching transistor 131 to be turned on or turned off.

As shown in FIG. 11C, the output terminal of the charge pump 142 is connected to the gate of the three-terminal NMOS-1 switching transistor 121, the gate of the three-terminal NMOS-2 switching transistor 122, and the gate of the first four-terminal NMOS switching transistor 131. The charge pump 142 is configured to output the output voltage $V_{out}$ to the gate of the three-terminal NMOS-1 switching transistor 121, the gate of the three-terminal NMOS-2 switching transistor 122, and the gate of the first four-terminal NMOS switching transistor 131. The output voltage $V_{out}$ is used as a gate drive voltage of the three-terminal NMOS-1 switching transistor 121, a gate drive voltage of the three-terminal NMOS-2 switching transistor 122, and a gate drive voltage of the first four-terminal NMOS switching transistor 131, and enables the three-terminal NMOS-1 switching transistor 121, the three-terminal NMOS-2 switching transistor 122, and the first four-terminal NMOS switching transistor 131 to be turned on or turned off.

Further, as shown in FIG. 10B, the charging protection circuit 13 further includes a pull-down circuit 1332. The pull-down circuit 1332 is connected to the Sub port, and the pull-down circuit 1332 is configured to: when the first four-terminal NMOS switching transistor 131 is turned off, pull down the potential of the Sub port to zero potential (or pull down the potential to zero). When the first four-terminal NMOS switching transistor 131 is turned off, because the potential of the Sub port is pulled down to zero, a voltage between the Sub port and the first drain or a voltage between the Sub port and the second drain is less than a voltage that triggers a parasitic transistor inside the first four-terminal NMOS switching transistor 131 to be turned on (referring to FIG. 8). Therefore, the first four-terminal NMOS switching transistor 131 is not mistakenly triggered, and further, a voltage withstanding capability of the first four-terminal NMOS switching transistor 131 is not decreased, or decreasing of the voltage withstanding capability of the first four-terminal NMOS switching transistor 131 is prevented at least to some extent.

Usually, when a base voltage of a transistor is greater than 0.7 V, the transistor is turned on. In this application, if a current flows from the first power supply interface 11 to the load 15, a base-emitter voltage (or a voltage between a base and an emitter) of the parasitic transistor inside the first four-terminal NMOS switching transistor 131 is a voltage between the Sub port and the second drain; and correspondingly, if the current flows from the load 15 to the first power supply interface 11, the base-emitter voltage (or the voltage between the base and the emitter) of the parasitic transistor inside the first four-terminal NMOS switching transistor 131 is a voltage between the Sub port and the first drain. For ease of description, the following uses an example in which a current flows from the first power supply interface 11 to the load 15, in other words, the base-emitter voltage of the parasitic transistor inside the first four-terminal NMOS switching transistor 131 is the voltage between the Sub port and the second drain. It should be noted that, in FIG. 8, a current also flows from the first power supply interface 11 to the load 15.

More specifically, as shown in FIG. 8, the first four-terminal NMOS switching transistor has a parasitic capacitor C1, a parasitic capacitor C2, and a parasitic transistor. When the first four-terminal NMOS switching transistor 131 is turned off, because the potential of the Sub port is pulled down to zero, the following case is avoided: the parasitic capacitor C2 of the three-terminal NMOS-2 switching transistor is charged by using the bus voltage $V_{bus}$ input from the first power supply interface 11. Therefore, there is no voltage at both terminals of the parasitic capacitor C2. Further, because there is no voltage at both the terminals of the parasitic capacitor C2, the parasitic transistor is not mistakenly triggered to be turned on, and therefore, the voltage withstanding capability of the first four-terminal NMOS switching transistor 131 is not decreased.

In an embodiment, as shown in FIG. 11A to FIG. 11C, the pull-down circuit 1332 is specifically a second three-terminal NMOS switching transistor (simply referred to as "three-terminal NMOS-3 switching transistor") 161. A source of the three-terminal NMOS-3 switching transistor 161 is grounded, a drain of the three-terminal NMOS-3 switching transistor 161 is connected to the Sub port, and a gate of the three-terminal NMOS-3 switching transistor 161 is connected to the drive circuit 140. A drive voltage provided by the drive circuit 140 enables one of the three-terminal NMOS-3 switching transistor 161 and the first four-terminal NMOS switching transistor 131 to be turned on while the other is turned off.

In a specific application, gate drive voltages provided by the drive circuit 140 to the three-terminal NMOS-3 switching transistor 161 and the first four-terminal NMOS switching transistor 131 have opposite phases.

A threshold voltage of the three-terminal NMOS-3 switching transistor 161 and the threshold voltage of the first four-terminal NMOS switching transistor 131 may have the same or different values.

Optionally, as shown in FIG. 11A to FIG. 11C, the Sub port management circuit 133 further includes an inverter 1333, an input terminal of the inverter 1333 is connected to the PWM module 141, and an output terminal is connected to the gate of the three-terminal NMOS-3 switching transistor 161. The inverter 1333 is configured to: perform phase inversion processing on $V_{pwm}$ to obtain a voltage $V_{\overline{pwm}}$, and apply $V_{\overline{pwm}}$ to the gate of the three-terminal NMOS-3 switching transistor 161. It can be learned that $V_{\overline{pwm}}$ is used as a gate drive voltage of the three-terminal NMOS-3 switching transistor 161, and enables the three-terminal NMOS-3 switching transistor 161 to be turned on or turned off.

Figure 11D:
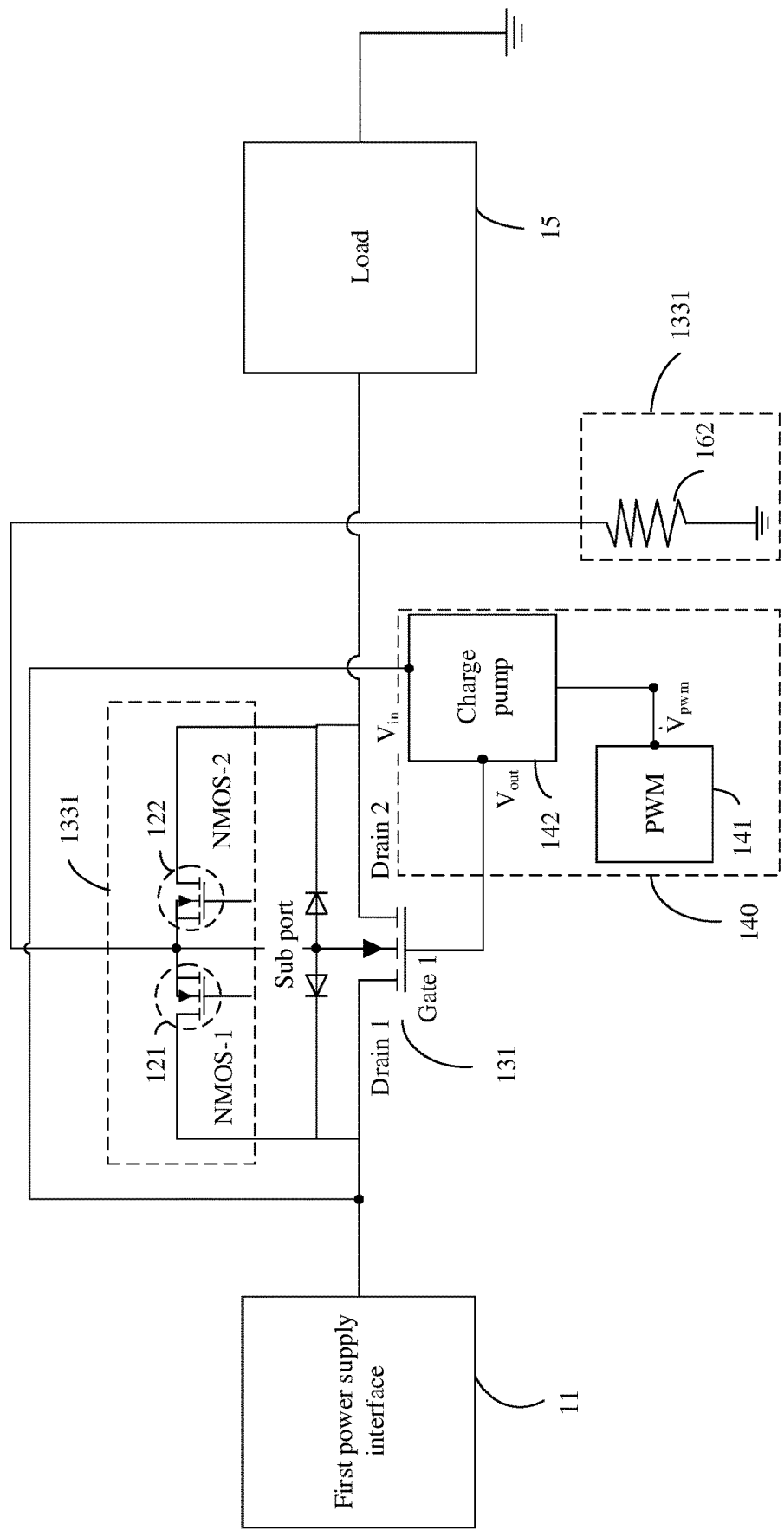
FIG. 11D is still another structural diagram of a charging protection circuit according to this application.

Because the drive voltage applied to the gate of the three-terminal NMOS-3 switching transistor 161 and the drive voltage applied to the gate of the first four-terminal NMOS switching transistor 131 have opposite phases, in this embodiment, the three-terminal NMOS-3 switching transistor 161 is turned on while the first four-terminal NMOS switching transistor 131 is turned off. When the three-terminal NMOS-3 switching transistor 161 is turned on, because the potential of the Sub port is pulled down to the GND, the parasitic transistor in the first four-terminal NMOS switching transistor 131 is not triggered to be turned on, and therefore, the voltage withstanding capability of the first four-terminal NMOS switching transistor 131 is not decreased. In another embodiment, as shown in FIG. 11D, a pull-down circuit 1332 is specifically a pull-down resistor 162. One terminal of the pull-down resistor 162 is connected to the Sub port, and the other terminal is grounded. When the first four-terminal NMOS switching transistor 131 is turned off, no current passes through the pull-down resistor 162. Therefore, the pull-down resistor 162 has no voltage, and a voltage of the Sub port is pulled down to the GND by the pull-down resistor 162. A voltage between the Sub port and the second drain is less than a voltage that triggers the parasitic transistor inside the first four-terminal NMOS switching transistor 131 to be turned on. Therefore, the parasitic transistor inside the first four-terminal NMOS switching transistor 131 is not mistakenly triggered, and further, the voltage withstanding capability of the first four-terminal NMOS switching transistor 131 is not decreased, or the decreasing is prevented at least to some extent.

Figure 12:
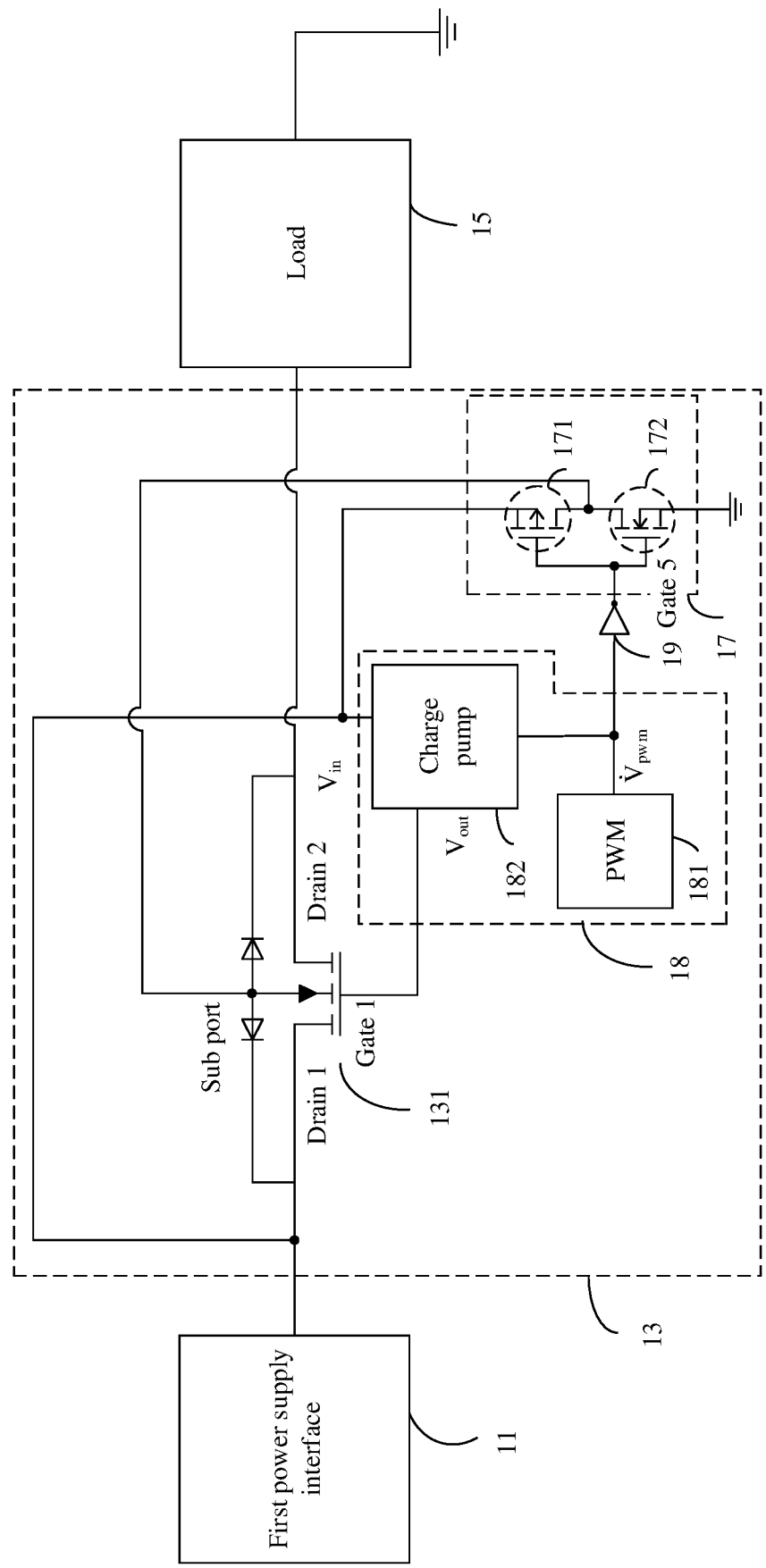
FIG. 12 is still another structural diagram of a charging protection circuit according to this application.

FIG. 12 is another schematic diagram of a charging protection circuit 13 according to this application. The charging protection circuit 13 includes a CMOS switching transistor 17. The CMOS switching transistor 17 includes a PMOS switching transistor 171 and a three-terminal NMOS-4 switching transistor 172 that have a common gate. A source of the PMOS switching transistor 171 is connected to the first power supply interface 11, and a drain is connected to the Sub port. A drain of the three-terminal NMOS-4 switching transistor 172 is connected to the Sub port, and a source is grounded. It should be noted that a threshold voltage of the PMOS switching transistor 171 and a threshold voltage of the three-terminal NMOS-4 switching transistor 172 have the same value but opposite phases (the PMOS switching transistor 171 and the three-terminal NMOS-4 switching transistor 172 are a P-type MOS switching transistor and an N-type MOS switching transistor that have threshold voltages with opposite phases). In addition, a voltage applied to the gate (Gate 5) of the PMOS switching transistor 171 and the three-terminal NMOS-4 switching transistor 172 and a drive voltage applied to the gate (Gate 1) of the first four-terminal NMOS switching transistor 131 have opposite phases.

As shown in FIG. 12, the charging protection circuit 13 further includes a drive circuit 18. An output terminal of the drive circuit 18 is connected to a gate of the first four-terminal NMOS switching transistor 131. The drive circuit 18 is configured to output a drive voltage to the gate of the first four-terminal NMOS switching transistor 131, and is further configured to control turn-on or turn-off of the first four-terminal NMOS switching transistor 131.

Optionally, as shown in FIG. 12, the drive circuit 18 includes a PWM module 181 and a charge pump 182. The charge pump 182 includes a first input terminal, a second input terminal, and an output terminal. Specifically, the first input terminal of the charge pump 182 is connected to an output terminal of the PWM module 181, and is configured to receive a control logic voltage $V_{pwm}$ output by the PWM module 181. The second input terminal of the charge pump 182 is connected to the first power supply interface 11, and is configured to receive a bus voltage $V_{bus}$ input from the first power supply interface 11. The charge pump 182 is configured to: process, under control of the control logic voltage $V_{pwm}$, the received bus voltage $V_{bus}$ to obtain an output voltage, and output the output voltage $V_{out}$ from the output terminal of the charge pump 182 to the gate of the first four-terminal NMOS switching transistor 131.

As shown in FIG. 12, the charging protection circuit 13 further includes an inverter 19. One terminal of the inverter 19 is connected to the output terminal of the PWM module 181, and the other terminal is connected to the gate (Gate 5) of the CMOS switching transistor 17 (to be specific, the PMOS switching transistor 171 and the three-terminal NMOS-4 switching transistor 172), the PWM module 181 outputs the control logic voltage $V_{pwm}$ to the inverter 19, and the inverter 19 performs phase inversion processing on the control logic voltage $V_{pwm}$ to obtain a voltage $V_{\overline{pwm}}$, and outputs the voltage $V_{\overline{pwm}}$ to the gate of the CMOS switching transistor 17 (to be specific, the PMOS switching transistor 171 and the three-terminal NMOS-4 switching transistor 172). The voltage $V_{\overline{pwm}}$ is used to control turn-on and turn-off of the PMOS switching transistor 171, and is used to control turn-on and turn-off of the three-terminal NMOS-4 switching transistor 172.

In this embodiment, when a high voltage is applied to the gate of the first four-terminal NMOS switching transistor 131, causing the first four-terminal NMOS switching transistor 131 to be turned on, and a low voltage is applied to the gate of the CMOS switching transistor 17, the PMOS switching transistor 171 in the CMOS switching transistor 17 is turned on, and the three-terminal NMOS-4 switching transistor 172 is turned off. In this case, because the Sub port is connected to the first power supply interface 11 by using the PMOS switching transistor 171, a voltage to ground $V_{sub}$ of the Sub port is equal to a voltage to ground $V_{bus}$ of the first power supply interface 11. In addition, because the first power supply interface 11 is connected to the first drain, a voltage to ground of the first drain is equal to the voltage to ground $V_{bus}$ of the first power supply interface 11. With reference to the foregoing description, it can be learned that the voltage to ground $V_{sub}$ of the Sub port is equal to the voltage to ground of the first drain. When the first four-terminal NMOS switching transistor 131 is turned on, because the voltage to ground of the first drain is equal to a voltage to ground of the second drain, the voltage to ground $V_{sub}$ of the Sub port is also equal to the voltage to ground of the second drain. In this way, there is neither voltage between the first drain and the Sub port nor voltage between the second drain and the Sub port. Therefore, a substrate bias effect between the Sub port (substrate) and each of the two drains is avoided. Correspondingly, the following problem is also avoided or prevented at least to some extent: the threshold voltage and the on resistance of the first four-terminal NMOS switching transistor 131 are increased due to a substrate bias effect and accordingly, a loss of the first four-terminal NMOS switching transistor 131 is increased.

When the gate of the first four-terminal NMOS switching transistor 131 is grounded and the first four-terminal NMOS switching transistor 131 is turned off, and a high voltage is applied to the gate of the CMOS switching transistor 17, the three-terminal NMOS-4 switching transistor 172 in the CMOS switching transistor 17 is turned on, and the PMOS switching transistor 171 is turned off. In this case, the potential of the Sub port is pulled down to the ground by the three-terminal NMOS-4 switching transistor 172 that is turned on. Therefore, the voltage between the Sub port and the first drain or the voltage between the Sub port and the first drain is less than a voltage that triggers the parasitic transistor inside the first four-terminal NMOS switching transistor 131 to be turned on. Therefore, the parasitic transistor inside the first four-terminal NMOS switching transistor 131 is not mistakenly triggered, and the voltage withstanding capability of the first four-terminal NMOS switching transistor 131 is not decreased, or is not decreased at least to some extent.

Figure 13:
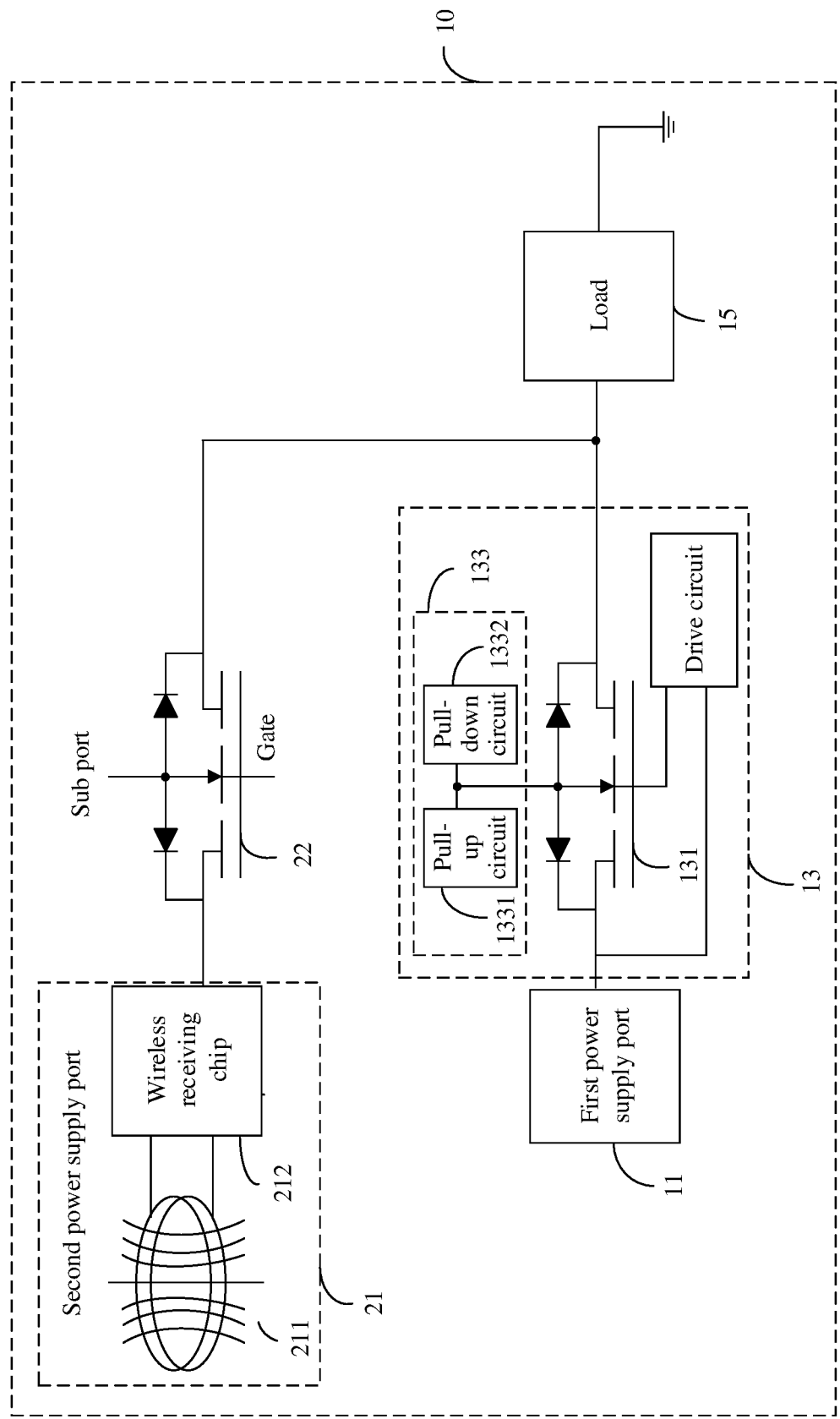
FIG. 13 is still another structural diagram of a charging protection circuit according to this application.

Based on any one of the foregoing embodiments, as shown in FIG. 13, the charging protection circuit 13 provided in this application further includes a second power supply interface 21 and a second four-terminal NMOS switching transistor 22. One drain of the second four-terminal NMOS switching transistor 22 is connected to the second power supply interface 21, the other drain of the second four-terminal NMOS switching transistor 22 is connected between the second drain of the first four-terminal NMOS switching transistor 131 and the load 15. It should be noted that for the second four-terminal NMOS switching transistor 22, refer to the foregoing limitation on the first four-terminal NMOS switching transistor 131. To be specific, potential floating management is performed on the Sub port of the second four-terminal NMOS switching transistor 22 with reference to the method for performing potential floating management on the Sub port of the first four-terminal NMOS switching transistor 131 in this application.

It can be learned that the charging protection circuit 13 provided in this application may have a plurality of power supply interfaces. A smartphone is used as an example. Because the smartphone can be charged in a wired manner and can also be charged in a wireless manner, the smartphone has at least two power supply interfaces.

It should be noted that the second power supply interface 21 may include a charging coil 211 and a wireless receiving chip 212. One terminal of the wireless receiving chip 212 is connected to the charging coil 211, and the other terminal is connected to a drain of the second four-terminal NMOS switching transistor 22. Because the second power supply interface 21 includes the charging coil 211, a power supply manner corresponding to the second power supply interface 21 is a wireless manner.

Figure 14:
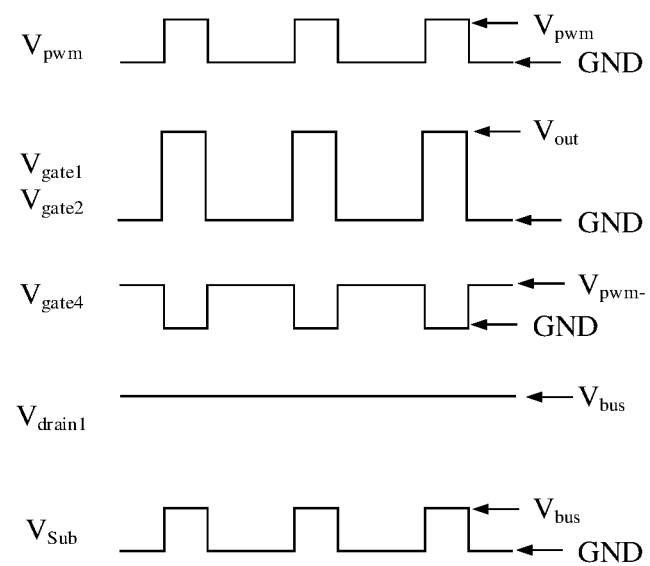
FIG. 14 is a working sequence diagram of voltages in a charging protection circuit according to this application.

FIG. 14 further shows a working sequence diagram of the charging protection circuit in this application. It is recommended that a working sequence described in FIG. 14 be understood with reference to FIG. 11A. As shown in FIG. 14, a voltage $V_{drain1}$ of the first drain is equal to the bus voltage $V_{bus}$, and the voltage $V_{sub}$ of the Sub port is related to the output voltage $V_{pwm}$ of the PWM module. When $V_{pwm}$ is a high voltage, $V_{sub}$ is also a high voltage, and when $V_{pwm}$ is a low voltage (or is grounded), $V_{sub}$ is also a low voltage (or is grounded). Still referring to FIG. 14, a gate drive voltage $V_{gate1}$ of the first four-terminal NMOS switching transistor 131 and a gate drive voltage $V_{gate2}$ of the three-terminal NMOS-1 switching transistor 121 have the same value and the same phase, and a gate drive voltage $V_{gae4}$ of the three-terminal NMOS-3 switching transistor 161 and $V_{pwm}$ have the same value but opposite phases. For the embodiments corresponding to FIG. 11B and FIG. 11C, refer to a working sequence diagram similar to that in FIG. 14. Details are not described herein again.

It should be noted that in this application, the embodiments of the charging protection circuit are described in a relatively detailed manner. In addition, descriptions of the embodiments of each of the charging circuit and the electronic device are relatively simple. However, because the charging circuit includes the charging protection circuit and the electronic device includes the charging circuit, for both the charging circuit and the electronic device, refer to the embodiments of the charging protection circuit described in this application. In other words, all other embodiments can also be understood with reference to content in any related part in this application. In this application, the embodiments may be mutually referenced.

What is claimed is:

1. A charging protection circuit, comprising:
   a first four-terminal N-type metal oxide semiconductor NMOS switching transistor, comprising a first drain, a second drain, a gate, and a Sub port, wherein the first drain is connected to a first power supply interface, the second drain is connected to a load, and the gate is connected to a drive circuit; and
   a Sub port management circuit, comprising a pull-up circuit connected to the Sub port, wherein the pull-up circuit is configured to: when the first four-terminal NMOS switching transistor is turned on, pull up potential of the Sub port to potential of the first drain or the second drain, wherein:
   the pull-up circuit comprises a first three-terminal NMOS switching transistor,
   a drain of the first three-terminal NMOS switching transistor is connected to the first drain of the first four-terminal NMOS switching transistor, a source of the first three-terminal NMOS switching transistor is connected to the Sub port, a gate of the first three-terminal NMOS switching transistor is connected to the drive circuit, and a drive voltage provided by the drive circuit enables both the first three-terminal NMOS switching transistor and the first four-terminal NMOS switching transistor to be turned on, a threshold voltage of the first three-terminal NMOS switching transistor and a threshold voltage of the first four-terminal NMOS switching transistor have a same value, and the drive circuit is configured to provide a same drive voltage for the gate of the first four-terminal NMOS switching transistor and the gate of the first three-terminal NMOS switching transistor.

2. The charging protection circuit according to claim 1, wherein the pull-up circuit further comprises a second three-terminal NMOS switching transistor; and a drain of the second three-terminal NMOS switching transistor is connected to the second drain of the first four-terminal NMOS switching transistor, a source of the second three-terminal NMOS switching transistor is connected to the Sub port, a gate of the second three-terminal NMOS switching transistor is connected to the drive circuit, and the drive voltage provided by the drive circuit enables both the second three-terminal NMOS switching transistor and the first four-terminal NMOS switching transistor to be turned on.

3. The charging protection circuit according to claim 2, wherein a threshold voltage of the second three-terminal NMOS switching transistor and the threshold voltage of the first four-terminal NMOS switching transistor have a same value, and the drive circuit is configured to provide drive voltages with a same phase for the gate of the first four-terminal NMOS switching transistor and the gate of the second three-terminal NMOS switching transistor.

4. The charging protection circuit according to claim 1, wherein the Sub port management circuit further comprises a pull-down circuit, and the pull-down circuit is connected to the Sub port, and is configured to: when the first four-terminal NMOS switching transistor is turned off, pull down the potential of the Sub port to zero potential.

5. The charging protection circuit according to claim 4, wherein the pull-down circuit comprises a third three-terminal NMOS switching transistor; and a source of the third three-terminal NMOS switching transistor is grounded, a drain of the third three-terminal NMOS switching transistor is connected to the Sub port, a gate of the third three-terminal NMOS switching transistor is connected to the drive circuit, and a drive voltage provided by the drive circuit enables one of the third three-terminal NMOS switching transistor and the first four-terminal NMOS switching transistor to be turned on while the other is turned off.

6. The charging protection circuit according to claim 5, wherein the drive circuit is configured to provide drive voltages with opposite phases for the gate of the third three-terminal NMOS switching transistor and the gate of the first four-terminal NMOS switching transistor.

7. The charge protection circuit according to claim 5, wherein the drive circuit comprises a pulse width modulation PWM module and a charge pump;

a first input terminal of the charge pump is connected to an output terminal of the PWM module, and is configured to receive a control logic voltage $V_{pwm}$ input by the charge pump;

a second input terminal of the charge pump is connected to the first power supply interface, and is configured to receive a bus voltage $V_{bus}$ input from the first power supply interface, and an output terminal of the charge pump is connected to the gate of the first four-terminal NMOS switching transistor; and the charge pump processes, under control of $V_{pwm}$, $V_{bus}$ to obtain an output voltage $V_{out}$, and applies $V_{out}$ to the gate of the first four-terminal NMOS switching transistor.

8. The charging protection circuit according to claim 7, wherein the Sub port management circuit further comprises an inverter; one terminal of the inverter is connected to the output terminal of the PWM module, and the other terminal is connected to the gate of the third three-terminal NMOS switching transistor; and the inverter is configured to: perform phase inversion processing on $V_{pwm}$ to obtain a voltage $V_{pwm'}$ and apply $V_{pwm'}$ to the gate of the third three-terminal NMOS switching transistor.

9. The charging protection circuit according to claim 4, wherein the pull-down circuit comprises a pull-down resistor, a first terminal of the pull-down resistor is connected to the Sub port, and a second terminal of the pull-down resistor is grounded.

10. The charging protection circuit according to claim 4, wherein the Sub port management circuit comprises a complementary metal oxide semiconductor CMOS switching transistor, the CMOS switching transistor comprises a P-type metal oxide semiconductor PMOS switching transistor and a fourth three-terminal NMOS switching transistor that have a common gate, the pull-up circuit comprises the PMOS switching transistor, and the pull-down circuit comprises the fourth three-terminal NMOS switching transistor, wherein a threshold voltage of the PMOS switching transistor and a threshold voltage of the fourth three-terminal NMOS switching transistor have a same value;

a source of the PMOS switching transistor is connected to the first power supply interface, a drain of the PMOS switching transistor is connected to the Sub port, a drain of the fourth three-terminal NMOS switching transistor is connected to the Sub port, and a source of the fourth three-terminal NMOS switching transistor is grounded; and a drive voltage applied to the gate of the PMOS switching transistor and the gate of the fourth three-terminal NMOS switching transistor and a drive voltage applied to the first four-terminal NMOS switching transistor have opposite phases.

11. The charging protection circuit according to claim 1, further comprising a second power supply interface and a second four-terminal NMOS switching transistor, one drain of the second four-terminal NMOS switching transistor is connected to the second power supply interface, and the other drain is connected between the second drain of the first four-terminal NMOS switching transistor and the load.

12. The charging protection circuit according to claim 11, wherein the second power supply interface comprises a charging coil and a wireless interface chip, the charging coil is connected to one terminal of the wireless receiving chip, and the other terminal of the wireless interface chip is connected to any drain of the second four-terminal NMOS switching transistor.

13. The charging protection circuit according to claim 1, wherein the first power supply interface is a universal serial bus USB port.

14. The charging protection circuit according to claim 1, wherein the load is a battery.

15. A charging circuit, comprising a first power supply interface, a load, and the charging protection circuit according to claim 1, wherein one terminal of the charging protection circuit is connected to the first power supply interface, the other terminal is connected to the load, and the charging protection circuit is configured to provide, for the load, power received from the first power supply interface.

16. An electronic device, comprising the charging circuit according to claim 15 and a processor, wherein the processor is configured to obtain remaining power information of a load in the charging circuit.

* * * * *